(12) United States Patent
Kim et al.

(10) Patent No.: US 11,949,044 B2
(45) Date of Patent: Apr. 2, 2024

(54) DISPLAY DEVICE AND METHOD OF MANUFACTURING THE SAME

(71) Applicant: SAMSUNG DISPLAY CO., LTD., Yongin-si (KR)

(72) Inventors: Buem Joon Kim, Yongin-si (KR); Hyun Deok Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 200 days.

(21) Appl. No.: 17/494,654

(22) Filed: Oct. 5, 2021

(65) Prior Publication Data
US 2022/0254958 A1 Aug. 11, 2022

(30) Foreign Application Priority Data
Feb. 5, 2021 (KR) .......................... 10-2021-0017068

(51) Int. Cl.
*H01L 33/36* (2010.01)
*H01L 21/68* (2006.01)
*H01L 25/075* (2006.01)

(52) U.S. Cl.
CPC .............. *H01L 33/36* (2013.01); *H01L 21/68* (2013.01); *H01L 25/0753* (2013.01); *H01L 2221/68309* (2013.01); *H01L 2933/0016* (2013.01)

(58) Field of Classification Search
CPC ........... H01L 21/68; H01L 2221/68309; H01L 33/36; H01L 33/62
See application file for complete search history.

(56) References Cited

U.S. PATENT DOCUMENTS

| | | | |
|---|---|---|---|
| 10,629,791 B2 | 4/2020 | Lim | |
| 10,910,512 B2 | 2/2021 | Sung | |
| 11,050,001 B2 | 6/2021 | Ko et al. | |
| 2019/0326348 A1* | 10/2019 | Im ....................... | H01L 25/0753 |

(Continued)

FOREIGN PATENT DOCUMENTS

| KR | 10-1672781 B1 | 11/2016 |
|---|---|---|
| KR | 10-2019-0096474 A | 8/2019 |

(Continued)

OTHER PUBLICATIONS

PCT International Search Report dated Jan. 21, 2022 issued in PCT/KR2021/014266, 3 pages.

*Primary Examiner* — Raj R Gupta
(74) *Attorney, Agent, or Firm* — Lewis Roca Rothgerber Christie LLP

(57) ABSTRACT

A display device and a method of manufacturing the same are provided. The display device includes a first alignment electrode and a second alignment electrode spaced apart from each other, a light emitting element between the first alignment electrode and the second alignment electrode, a first auxiliary electrode at a first side of the light emitting element in a plan view, and separated from the first alignment electrode, and a second auxiliary electrode at a second side of the light emitting element in a plan view, and separated from the second alignment electrode, wherein an alignment signal is configured to be applied to the first alignment electrode, and wherein a first auxiliary signal of a phase that is different from a phase of the alignment signal is configured to be applied to the first auxiliary electrode.

11 Claims, 27 Drawing Sheets

(56) References Cited

U.S. PATENT DOCUMENTS

2020/0144453 A1    5/2020  Chang et al.
2020/0403131 A1   12/2020  Kim et al.

FOREIGN PATENT DOCUMENTS

| KR | 10-2020-0052512 A | 5/2020 |
| KR | 10-2020-0053726 A | 5/2020 |
| KR | 10-2020-0088962 A | 7/2020 |
| KR | 10-2020-0121956 A | 10/2020 |
| KR | 10-2020-0145966 A | 12/2020 |

\* cited by examiner

DISPLAY DEVICE AND METHOD OF MANUFACTURING THE SAME

CROSS-REFERENCE TO RELATED APPLICATION

This application claims priority to, and the benefit of, Korean Patent Application No. 10-2021-0017068, filed on Feb. 5, 2021, the content of which in its entirety is herein incorporated by reference.

BACKGROUND

1. Field

The disclosure relates to a display device, and to a method of manufacturing the same.

2. Description of the Related Art

In recent years, as interest in information display is increasing, research and development for a display device are continuously being conducted.

SUMMARY

An aspect of the present disclosure provides a display device and a method of manufacturing the same to improve deflection alignment efficiency of light emitting elements. However, the present disclosure is not limited to the above-described aspect, and other aspects that are not described will be clearly understood by those skilled in the art from the following description.

A display device according to some embodiments includes a first alignment electrode and a second alignment electrode spaced apart from each other, a light emitting element between the first alignment electrode and the second alignment electrode, a first auxiliary electrode at a first side of the light emitting element in a plan view, and separated from the first alignment electrode, and a second auxiliary electrode at a second side of the light emitting element in a plan view, and separated from the second alignment electrode, wherein an alignment signal is configured to be applied to the first alignment electrode, and wherein a first auxiliary signal of a phase that is different from a phase of the alignment signal is configured to be applied to the first auxiliary electrode.

The first auxiliary electrode may be between the first alignment electrode and a center of the light emitting element in a plan view, wherein the second auxiliary electrode is between the second alignment electrode and the center of the light emitting element in a plan view.

The display device may further include a third auxiliary electrode between the first auxiliary electrode and the center of the light emitting element in a plan view, and separated from the first auxiliary electrode, and a fourth auxiliary electrode between the second auxiliary electrode and the center of the light emitting element in a plan view, and separated from the second auxiliary electrode.

The first alignment electrode may be between the first auxiliary electrode and the light emitting element in a plan view, wherein the second alignment electrode is between the second auxiliary electrode and the light emitting element in a plan view.

The display device may further include a third auxiliary electrode between the first alignment electrode and a center of the light emitting element in a plan view, and a fourth auxiliary electrode between the second alignment electrode and the center of the light emitting element in a plan view.

The third auxiliary electrode may be electrically separated from the first alignment electrode and the first auxiliary electrode.

The display device may further include a third auxiliary electrode between the first auxiliary electrode and the first alignment electrode in a plan view, and a fourth auxiliary electrode between the second auxiliary electrode and the second alignment electrode in a plan view.

The third auxiliary electrode may be configured to receive a second auxiliary signal of a phase that is different from a phase of the alignment signal and a phase of the first auxiliary signal.

The first auxiliary electrode may be on the same layer as the first alignment electrode.

The display device may further include an insulating layer between the first auxiliary electrode and the first alignment electrode.

The display device may further include a first connection electrode electrically connecting the first alignment electrode and one end of the light emitting element, and a second connection electrode electrically connecting the second alignment electrode and another end of the light emitting element.

The light emitting element may be electrically separated from the first auxiliary electrode and the second auxiliary electrode.

A method of manufacturing a display device according to some embodiments includes forming a first alignment electrode and a second alignment electrode spaced apart from each other, forming a first auxiliary electrode and a second auxiliary electrode separated from the first alignment electrode and the second alignment electrode, and aligning a light emitting element between the first alignment electrode and the second alignment electrode by applying an alignment signal to the first alignment electrode, and applying a first auxiliary signal of a phase that is different from a phase of the alignment signal to the first auxiliary electrode.

The method may further include setting the alignment signal to a voltage of a negative polarity, and setting the first auxiliary signal to a voltage of a positive polarity.

Aligning the light emitting element may include applying a ground voltage to the second alignment electrode and to the second auxiliary electrode.

The method may further include concurrently forming the first alignment electrode and the first auxiliary electrode.

The method may further include forming a third auxiliary electrode and a fourth auxiliary electrode separated from the first auxiliary electrode and the second auxiliary electrode, wherein aligning the light emitting element includes applying a second auxiliary signal of a phase that is different from a phase of the alignment signal and that is different from a phase of the first auxiliary signal to the third auxiliary electrode.

The method may further include setting the alignment signal to a voltage of a negative polarity, changing the first auxiliary signal from a voltage of a positive polarity to a voltage of the negative polarity, and changing the second auxiliary signal from a voltage of the negative polarity to a voltage of the positive polarity.

Aligning the light emitting element may include applying a ground voltage to the fourth auxiliary electrode.

The method may further include concurrently forming the first auxiliary electrode and the third auxiliary electrode.

Details of other embodiments are included in the detailed description and drawings.

According to some embodiments of the present disclosure, even though an electric field corresponding to alignment electrodes (or an alignment signal) is formed in an opposite direction in a process of aligning light emitting elements, the electric field may be formed so that the light emitting elements rotate in a forward direction using auxiliary electrodes (or an auxiliary signal). Therefore, deflection alignment efficiency of the light emitting elements may be improved.

Aspects of the embodiments are not limited by the contents illustrated above, and other aspects are included in the present specification.

BRIEF DESCRIPTION OF THE DRAWINGS

The above and other aspects of the disclosure will become more apparent by describing in further detail embodiments of the present disclosure with reference to the accompanying drawings, in which.

DETAILED DESCRIPTION

Figure 1:
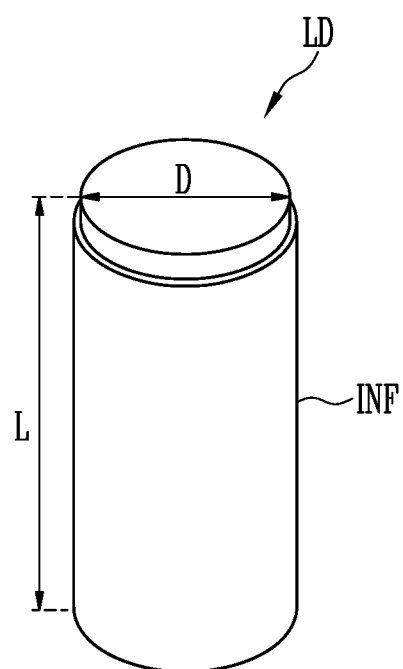
FIGS. 1 and 2 are respectively perspective and cross-sectional views illustrating a light emitting element according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection.

For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
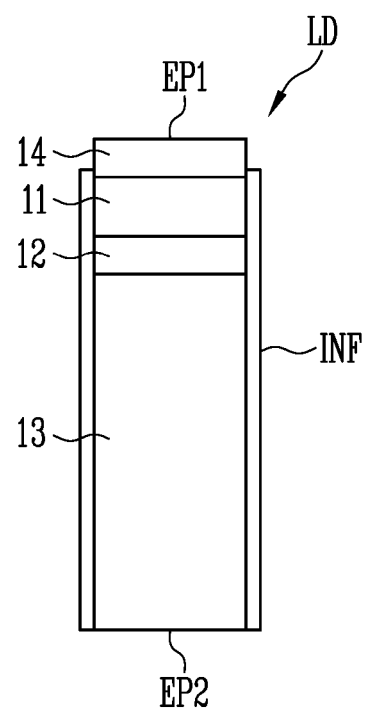

FIGS. 1 and 2 are respectively perspective and cross-sectional views illustrating a light emitting element according to some embodiments. FIGS. 1 and 2 show a column shape light emitting element LD, but a type and/or a shape of the light emitting element LD are/is not limited thereto.

Referring to FIGS. 1 and 2, the light emitting element LD may include a first semiconductor layer 11, an active layer 12, a second semiconductor layer 13, and/or a contact electrode 14.

The light emitting element LD may be formed in a column shape extending along one direction. The light emitting element LD may have a first end portion EP1 and a second end portion EP2. One of the first and second semiconductor layers 11 and 13 may be located at the first end portion EP1 of the light emitting element LD, while the other of the first and second semiconductor layers 11 and 13 may be located at the second end portion EP2 of the light emitting element LD. For example, the first semiconductor layer 11 may be located at the first end portion EP1 of the light emitting element LD, and the second semiconductor layer 13 may be located at the second end portion EP2 of the light emitting element LD.

According to some embodiments, the light emitting element LD may be a light emitting element manufactured in a column shape through an etching method or the like. In the present specification, the column shape includes a rod-like shape or a bar-like shape of an aspect ratio is greater than about 1, such as a circular column or a polygonal column, and the shape of the cross-section thereof is not limited.

The light emitting element LD may have a size as small as a nanometer scale to a micrometer scale. For example, each light emitting element LD may have a diameter D (or width) and/or a length L of a nanometer scale to micrometer scale range. However, a size of the light emitting element LD is not limited thereto, and the size of the light emitting element LD may be variously changed according to a design condition of various devices using a light emitting device using the light emitting element LD as a light source, for example, a display device.

The first semiconductor layer 11 may be a semiconductor layer of a first conductivity type. For example, the first semiconductor layer 11 may include a p-type semiconductor layer. For example, the first semiconductor layer 11 may include at least one semiconductor material among InAlGaN, GaN, AlGaN, InGaN, AlN, and/or InN, and may include a p-type semiconductor layer doped with a first conductivity type dopant such as Mg. However, the material configuring the first semiconductor layer 11 is not limited thereto, and various other materials may configure the first semiconductor layer 11.

The active layer 12 may be located between the first semiconductor layer 11 and the second semiconductor layer 13 and may be formed in a single-quantum well or multi-quantum well structure. A position of the active layer 12 may be variously changed according to the type of the light emitting element LD. According to some embodiments, a material of AlGaN, InAlGaN, or the like may be used to form the active layer 12, and various other materials may configure the active layer 12. In other embodiments, a clad layer doped with a conductive dopant may be formed on and/or under the active layer 12. For example, the clad layer may be formed of AlGaN or InAlGaN.

The second semiconductor layer 13 may be located on the active layer 12 and may include a semiconductor layer of a type that is different from that of the first semiconductor layer 11. The second semiconductor layer 13 may include an n-type semiconductor layer. For example, the second semiconductor layer 13 may include any semiconductor material among InAlGaN, GaN, AlGaN, InGaN, AlN, and/or InN, and may include an n-type semiconductor layer doped with a second conductivity type dopant such as Si, Ge, and Sn. However, the material configuring the second semiconductor layer 13 is not limited thereto, and the second semiconductor layer 13 may be configured of various other materials.

When a voltage that is equal to or greater than a threshold voltage is applied across the ends of the light emitting element LD, an electron-hole pair is combined in the active layer 12, and thus the light emitting element LD emits light. By controlling light emission of the light emitting element LD using such a principle, the light emitting element LD may be used as a light source of various light emitting devices including a pixel of a display device.

The contact electrode 14 may be located on the first end portion EP1 and/or the second end portion EP2 of the light emitting element LD. FIG. 2 illustrates a case in which the contact electrode 14 is formed on the first semiconductor layer 11, but the present disclosure is not limited thereto. For example, a separate contact electrode may be further located on the second semiconductor layer 13.

The contact electrode 14 may include a transparent metal or a transparent metal oxide. For example, the contact electrode 14 may include at least one of indium tin oxide (ITO), indium zinc oxide (IZO), zinc oxide (ZnO), and/or zinc tin oxide (ZTO), but the present disclosure is not limited thereto. As described above, when the contact electrode 14 is formed of the transparent metal or the transparent metal oxide, light generated in the active layer 12 of the light emitting element LD may pass through the contact electrode 14, and may be emitted to the outside of the light emitting element LD.

The light emitting element LD may further include an insulating film INF formed on a surface. The insulating film INF may be directly located on the surface of the first semiconductor layer 11, the active layer 12, the second semiconductor layer 13, and/or the contact electrode 14. The insulating film INF may expose the first and second end portions EP1 and EP2 of the light emitting element LD having different polarities. According to some embodiments, the insulating film INF may expose a side portion of the contact electrode 14 and/or the second semiconductor layer 13 adjacent to the first and second end portions EP1 and EP2 of the light emitting element LD.

The insulating film INF may include at least one of aluminum oxide (AlOx), aluminum nitride (AlNx), silicon oxide (SiOx), silicon nitride (SiNx), silicon oxynitride (SiOxNy), zirconium oxide (ZrOx), hafnium oxide (HfOx), and/or titanium oxide (TiOx). For example, the insulating film INF may be configured of a double layer, and each layer configuring the double layer may include different materials. In this case, each layer configuring the double layer of the insulating film INF may be formed by different processes. In some embodiments, the insulating film INF may be configured of a double layer configured of aluminum oxide (AlOx) and silicon oxide (SiOx), but the present disclosure is not limited thereto. According to some embodiments, the insulating film INF may be omitted.

When the insulating film INF is provided on the surface of the light emitting element LD, the likelihood of the active layer 12 short-circuiting with at least one electrode (for example, at least one of connection electrodes connected to respective ends of the light emitting element LD), or the like, may be reduced or prevented. Accordingly, electrical stability of the light emitting element LD may be secured. In addition, life and efficiency may be improved by reducing or minimizing a surface defect of the light emitting element LD.

A light emitting device including the light emitting element LD described above may be used in various types of devices that require a light source, including a display device. For example, a plurality of light emitting elements LD may be located in each pixel of a display panel, and the light emitting elements LD may be used as a light source of each pixel. However, an application field of the light emitting element LD is not limited to the above-described example. For example, the light emitting element LD may also be used in other types of devices that require a light source, such as a lighting device.

Figure 3:
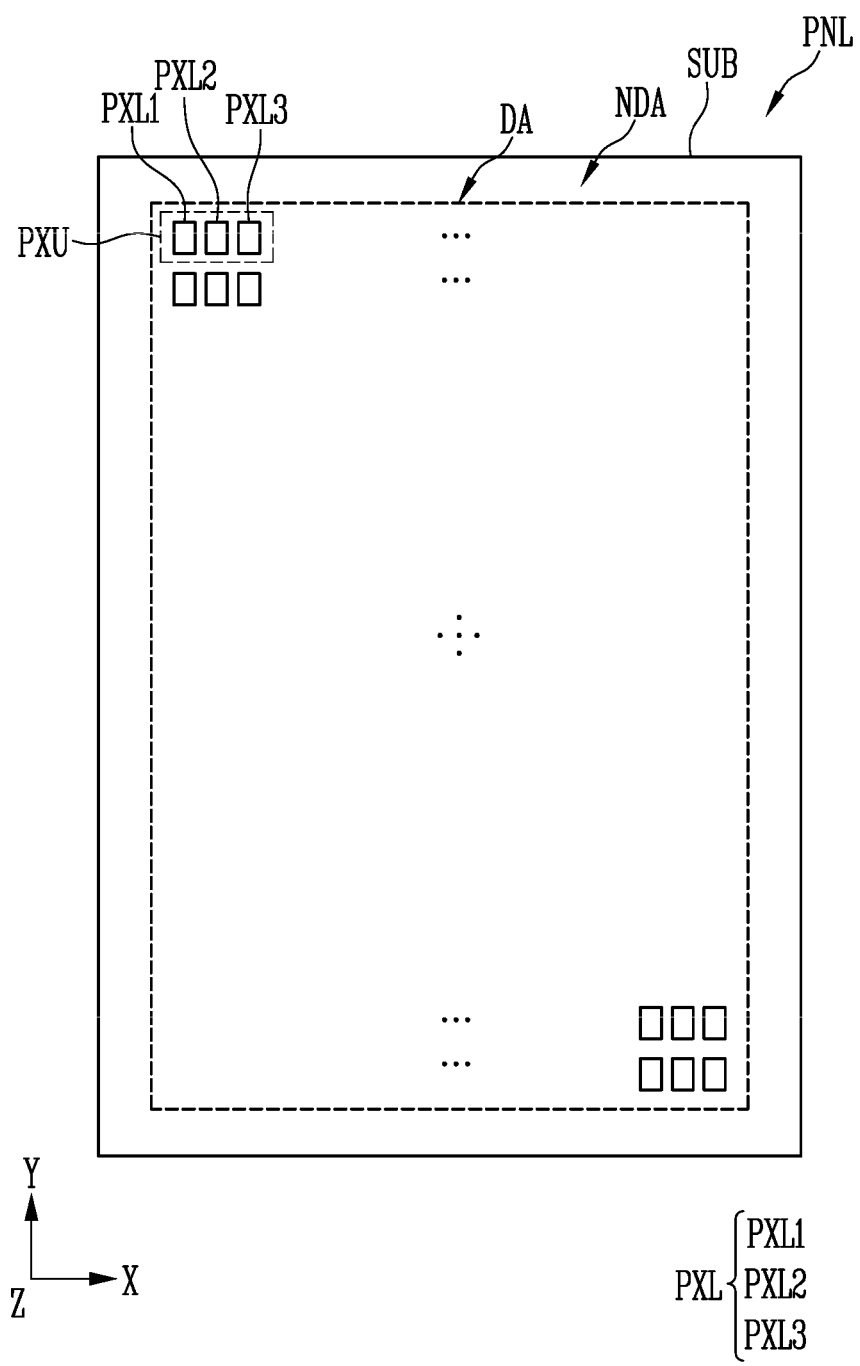
FIG. 3 is a plan view illustrating a display device according to some embodiments.

FIG. 3 is a plan view illustrating a display device according to some embodiments.

In FIG. 3, as an example of an electronic device that may use the light emitting element LD described in the embodiments of FIGS. 1 and 2 as a light source, a display device, for example, a display panel PNL provided in the display device is shown.

Each pixel unit PXU of the display panel PNL and each pixel configuring the each pixel unit PXU may include at least one light emitting element LD. For convenience of description, in FIG. 3, a structure of the display panel PNL is briefly shown based on a display area DA. However, according to some embodiments, at least one driving circuit unit (for example, at least one of a scan driver and a data driver), lines, and/or pads, which are/is not shown, may be further located on the display panel PNL.

Referring to FIG. 3, the display panel PNL may include a substrate SUB and a pixel unit PXU located on the substrate SUB. The pixel unit PXU may include first pixels PXL1, second pixels PXL2, and/or third pixels PXL3. Hereinafter, when at least one pixel among the first pixels PXL1, the second pixels PXL2, and the third pixels PXL3 is arbitrarily referred to, or when two or more types of pixels are collectively referred to, one or more of the pixels may be referred to as a "pixel (PXL)" or "pixels PXL."

The substrate SUB may configure a base member of the display panel PNL, and may be a rigid or flexible substrate or film. For example, the substrate SUB may be a rigid substrate formed of glass or tempered glass, or a flexible substrate (or a thin film) of a plastic or metal material, and the material and/or a physical property of the substrate SUB are/is not limited.

The display panel PNL and the substrate SUB for forming the display panel PNL may include the display area DA for displaying an image and a non-display area NDA excluding the display area DA. The pixels PXL may be located in the display area DA. Various lines, pads, and/or a built-in circuit unit connected to the pixels PXL of the display area DA may be located in the non-display area NDA. The pixels PXL may be regularly arranged according to a stripe or PenTile/PENTILE® arrangement structure, or the like (e.g., a PENTILE® matrix structure, an RGBG structure, or a PENTILE® structure). PENTILE® is a registered trademark of Samsung Display Co., Ltd., Republic of Korea. However, the arrangement structure of the pixels PXL is not limited thereto, and the pixels PXL may be arranged in the display area DA in various structures and/or methods.

According to some embodiments, two or more types of pixels PXL for emitting light of different respective colors may be located in the display area DA. For example, in the display area DA, the first pixels PXL1 for emitting light of a first color, the second pixels PXL2 for emitting light of a second color, and the third pixels PXL3 for emitting light of a third color may be arranged. At least one of the first to third pixels PXL1, PXL2, and PXL3 arranged to be adjacent to each other may configure one pixel unit PXU capable of emitting light of various colors. For example, each of the first to third pixels PXL1, PXL2, and PXL3 may be a sub pixel for emitting respective light of a corresponding color. According to some embodiments, the first pixel PXL1 may be a red pixel for emitting red light, the second pixel PXL2 may be a green pixel for emitting green light, and the third pixel PXL3 may be a blue pixel for emitting blue light, but are not limited thereto.

In some embodiments, the first pixel PXL1, the second pixel PXL2, and the third pixel PXL3 may include light emitting elements that emit light of the same color, and may include a color conversion layer and/or a color filter of different colors located on the respective light emitting element to thereby emit light of the first color, the second color, and the third color, respectively. In other embodiments, the first pixel PXL1, the second pixel PXL2, and the third pixel PXL3 may include a light emitting element of the first color, a light emitting element of the second color, and a light emitting element of the third color as a light source to thereby emit light of the first color, the second color, and the third color, respectively. However, the color, type, number, and/or the like of pixels PXL configuring each pixel unit PXU are/is not limited. That is, the color of light emitted by each pixel PXL may be variously changed.

The pixel PXL may include at least one light source driven by a control signal (e.g., a predetermined control signal, for example, a scan signal and/or a data signal) and/or power (e.g., predetermined power, for example, first power and/or second power). In some embodiments, the light source may include at least one light emitting element LD according to any one of the embodiments of FIGS. 1 and 2, for example, an ultra-small column shape light emitting elements LD having a size as small as a nanometer scale to a micrometer scale. However, the disclosure is not limited thereto, and various types of light emitting elements LD may be used as the light source of the pixel PXL.

In some embodiments, each pixel PXL may be configured as an active pixel. However, a type, a structure, and/or a driving method of the pixels PXL applicable to the display device are/is not limited. For example, each pixel PXL may be configured as a pixel of a passive or active light emitting display device of various structures and/or driving methods.

Figure 4:
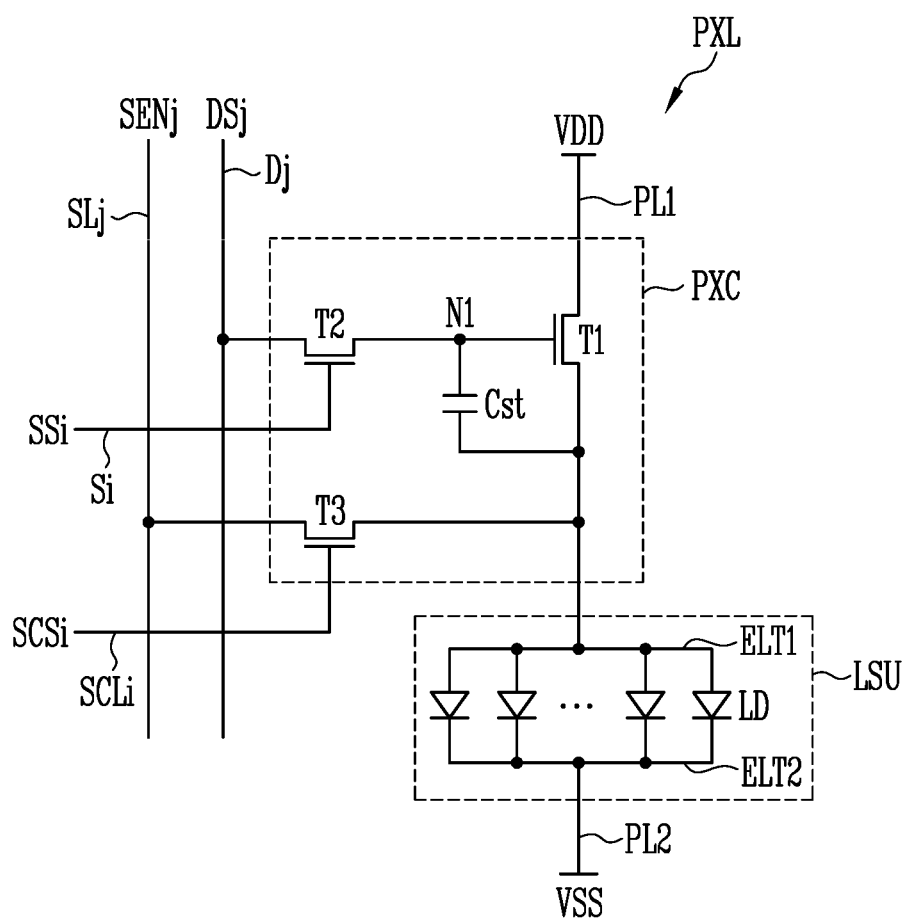
FIG. 4 is a circuit diagram illustrating a pixel according to some embodiments.

FIG. 4 is a circuit diagram illustrating a pixel according to some embodiments.

According to some embodiments, the pixel PXL shown in FIG. 4 may be any one of the first pixel PXL1, the second pixel PXL2, and the third pixel PXL3 provided in the display panel PNL of FIG. 1. The first pixel PXL1, the second pixel PXL2, and the third pixel PXL3 may have a structure substantially the same as or similar to each other.

Referring to FIG. 4, the pixel PXL may include a light emitting unit LSU for generating light of a luminance corresponding to a data signal, and a pixel circuit PXC for driving the light emitting unit LSU.

The light emitting unit LSU may include at least one light emitting element LD connected between first power VDD and second power VSS. For example, the light emitting unit LSU may include a first electrode ELT1 connected to the first power VDD through the pixel circuit PXC and a first power line PL1, may include a second electrode ELT2 connected to the second power VSS through a second power line PL2, and may include a plurality of light emitting elements LD electrically connected between the first and second electrodes ELT1 and ELT2. In some embodiments, the first electrode ELT1 may be an anode electrode, and the second electrode ELT2 may be a cathode electrode.

Each of the light emitting elements LD may include a first end portion connected to the first power VDD through the first electrode ELT1 and/or the pixel circuit PXC, and a second end portion connected to the second power VSS through the second electrode ELT2. That is, the light emitting elements LD may be connected in a forward direction between the first and second electrodes ELT1 and ELT2. Each light emitting element LD connected in the forward direction between the first power VDD and the second power VSS may configure each effective light source, and the effective light sources may be gathered to configure the light emitting unit LSU of the pixel PXL.

The first power VDD and the second power VSS may have different potentials so that the light emitting elements LD may emit light. For example, the first power VDD may be set as high potential power, and the second power VSS may be set as low potential power. At this time, a potential difference between the first power VDD and the second power VSS may be set to be equal to or greater than a threshold voltage of the light emitting elements LD during an emission period of the pixel PXL.

One end portion of the light emitting elements LD configuring each light emitting unit LSU may be commonly connected to the pixel circuit PXC through one electrode (for example, the first electrode ELT1 of each pixel PXL) of the light emitting unit LSU, and may be connected to the first power VDD through the pixel circuit PXC and the first power line PL1. Another end portion of the light emitting elements LD may be commonly connected to the second power VSS through another electrode (for example, the second electrode ELT2 of each pixel PXL) of the light emitting unit LSU and the second power line PL2.

The light emitting elements LD may emit light at a luminance corresponding to a driving current supplied through the pixel circuit PXC. For example, during each frame period, the pixel circuit PXC may supply a driving current corresponding to a grayscale value to be expressed in a corresponding frame to the light emitting unit LSU. The driving current supplied to the light emitting unit LSU may be divided and may flow to the light emitting elements LD connected in the forward direction. Accordingly, while each light emitting element LD emits light at a luminance corresponding to the current flowing therethrough, the light emitting unit LSU may emit light of the luminance corresponding to the driving current.

The pixel circuit PXC may be connected between the first power VDD and the first electrode ELT1. The pixel circuit PXC may be connected to a scan line Si and a data line Dj of a corresponding pixel PXL. For example, when the pixel PXL is located on an i-th (i is a natural number) horizontal line (row) and a j-th (j is a natural number) vertical line (column) of the display area DA, the pixel circuit PXC may be connected to an i-th scan line Si and to a j-th data line Dj of the display area DA.

According to some embodiments, the pixel circuit PXC may include a plurality of transistors T1, T2, and T3, and at least one storage capacitor Cst.

The first transistor T1 may be connected between the first power VDD and the light emitting unit LSU. For example, a first electrode (for example, a drain electrode) of the first transistor T1 may be connected to the first power VDD, and a second electrode (for example, a source electrode) of the first transistor T1 may be connected to the first electrode ELT1. A gate electrode of the first transistor T1 may be connected to a first node N1. The first transistor T1 may control the driving current supplied to the light emitting unit LSU in correspondence with a voltage of the first node N1. That is, the first transistor T1 may be a driving transistor that controls the driving current of the pixel PXL.

The second transistor T2 may be connected between the data line Dj and the first node N1. For example, a first electrode of the second transistor T2 may be connected to the data line Dj, and a second electrode of the second transistor T2 may be connected to the first node N1. A gate electrode of the second transistor T2 may be connected to the scan line Si. The second transistor T2 may be turned on when a scan signal SSi of a gate-on voltage (for example, a low level voltage) is supplied from the scan line Si, to electrically connect the data line Dj and the first node N1.

In each frame period, a data signal DSj of a corresponding frame may be supplied to the data line Dj, and the data signal DSj may be transferred to the first node N1 through the second transistor T2 which is turned on during a period in which the scan signal SSi of the gate-on voltage is supplied. That is, the second transistor T2 may be a switching transistor for transferring each data signal DSj to an interior/inside of the pixel PXL.

The third transistor T3 may be connected between the first transistor T1 and a sensing line SLj. For example, one electrode of the third transistor T3 may be connected to the second electrode (for example, the source electrode) of the first transistor T1 connected to the first electrode ELT1, and another electrode of the third transistor T3 may be connected to the sensing line SLj. Meanwhile, in other embodiments, when the sensing line SLj is omitted, the other electrode of the third transistor T3 may be connected to the data line Dj.

A gate electrode of the third transistor T3 may be connected to a sensing control line SCLi. When the sensing control line SCLi is omitted, the gate electrode of the third transistor T3 may be connected to the scan line Si. The third transistor T3 is turned on by a sensing control signal SCSi of a gate-on voltage (for example, a high level voltage) supplied to the sensing control line SCLi during a sensing period (e.g., a predetermined sensing period), to electrically connect the sensing line SLj and the first transistor T1.

According to some embodiments, the sensing period may be a period for extracting a characteristic(s) (for example, a threshold voltage or the like of the first transistor T1) of each of the pixels PXL located in the display area DA. During the sensing period, the first transistor T1 may be turned on by supplying a reference voltage (e.g., a predetermined reference voltage), which may turn on the first transistor T1, to the first node N1 through the data line Dj and the second transistor T2, or by connecting each pixel PXL to a current source or the like. In addition, the first transistor T1 may be connected to the sensing line SLj by turning on the third transistor T3 by supplying the sensing control signal SCSi of the gate-on voltage to the third transistor T3. Thereafter, the sensing signal SENj may be obtained through the sensing line SLj, and the characteristic(s) of each pixel PXL, which may include the threshold voltage of the first transistor T1, may be detected using the sensing signal SENj. Information on the characteristic of each pixel PXL may be used to convert image data so that a characteristic deviation between the pixels PXL located in the display area DA may be compensated.

One electrode of the storage capacitor Cst may be connected to the second electrode of the first transistor T1, and another electrode of the storage capacitor Cst may be connected to the first node N1. The storage capacitor Cst may charge a voltage corresponding to the data signal DSj supplied to the first node N1 during each frame period.

Meanwhile, in FIG. 4, embodiments in which all of the first, second, and third transistors T1, T2, and T3 are n-type transistors are disclosed, but the present disclosure is not limited thereto. For example, at least one of the first, second, and third transistors T1, T2, and T3 may be changed to a p-type transistor.

In addition, in FIG. 4, embodiments in which all of effective light sources, that is, in which the light emitting elements LD that configure each light emitting unit LSU and that are connected in parallel, are shown, but the present disclosure is not limited thereto. For example, the light emitting unit LSU of each pixel PXL may also be configured to include at least two stages of serial structure. In this case, the light emitting elements configuring each serial stage may be connected in series to each other by at least one intermediate electrode.

Figure 5:
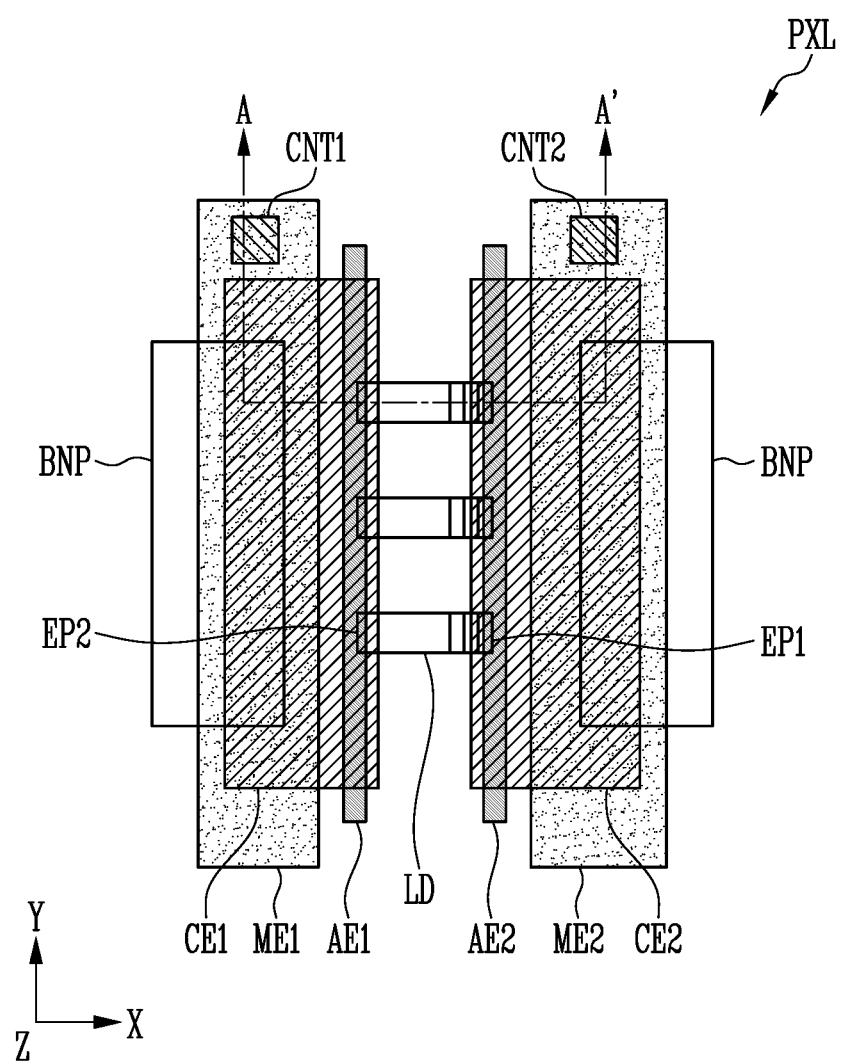
FIG. 5 is a plan view illustrating a pixel according to some embodiments.

FIG. 5 is a plan view illustrating a pixel according to some embodiments, and FIGS. 6 to 9 are cross-sectional views taken along the line A-A' of FIG. 5.

For example, FIG. 5 may be any one of the first to third pixels PXL1, PXL2, and PXL3 configuring the pixel unit PXU of FIG. 3, and the first to third pixels PXL1, PXL2, and PXL3 may have substantially the same or similar structure.

Each pixel PXL may include a first alignment electrode ME1, a second alignment electrode ME2, the light emitting elements LD, a first auxiliary electrode AE1, and a second auxiliary electrode AE2.

Each of the first and second alignment electrodes ME1 and ME2 may extend in a second direction (Y-axis direction), and may be located to be spaced apart from each other along a first direction (X-axis direction). However, the disclosure is not limited thereto, and a shape, a mutual disposition relationship, and/or the like of the first and second alignment electrodes ME1 and ME2 may be variously changed.

The first and second alignment electrodes ME1 and ME2 may receive an alignment signal (or alignment voltage) in an alignment operation of the light emitting elements LD. Accordingly, an electric field may be formed between the first and second alignment electrodes ME1 and ME2, and thus the light emitting elements LD supplied to each pixel PXL may be aligned between the first and second alignment electrodes ME1 and ME2.

The first alignment electrode ME1 may be electrically connected to the second power VSS (or the second power line PL2) described with reference to FIG. 4 through a first contact hole CNT1, and the second alignment electrode ME2 may be electrically connected to the first transistor T1 described with reference to FIG. 4 and the like. For example, the first alignment electrode ME1 may correspond to the second electrode ELT2 of FIG. 4, and the second alignment electrode ME2 may correspond to the first electrode ELT1 of FIG. 4.

The light emitting elements LD may be located between the first and second alignment electrodes ME1 and ME2. The light emitting elements LD may be aligned with a directionality between the first and second alignment electrodes ME1 and ME2. For example, when the light emitting elements LD are deflected in a forward direction, the first end portion EP1 of the light emitting elements LD may face the second alignment electrode ME2, and the second end portion EP2 of the light emitting elements LD may face the first alignment electrode ME1.

According to some embodiments, the light emitting elements LD may be prepared in a dispersed form in a solution (e.g., a predetermined solution), and may be supplied to each pixel PXL through an inkjet printing method or a slit coating method. For example, the light emitting elements LD may be mixed with a volatile solvent and supplied to each pixel PXL. At this time, when a voltage (e.g., a predetermined voltage) is applied between, or across, the first and second alignment electrodes ME1 and ME2, an electric field may be formed between the first and second alignment electrodes ME1 and ME2, and thus the light emitting elements LD may be aligned between the first and second alignment electrodes ME1 and ME2. After the light emitting elements LD are aligned, the solvent may be volatilized or removed in other methods, and thus the light emitting elements LD may be stably arranged between the first and second alignment electrodes ME1 and ME2.

Each of the first and second auxiliary electrodes AE1 and AE2 may extend in the second direction (Y-axis direction), and may be located to be spaced apart from each other along a first direction (X-axis direction). The first and second auxiliary electrodes AE1 and AE2 may be separated from, and spaced apart from, the first and second alignment electrodes ME1 and ME2.

In some embodiments, the first and second auxiliary electrodes AE1 and AE2 may be located between the first alignment electrode ME1 and the second alignment electrode ME2. The first auxiliary electrode AE1 may be located between the first alignment electrode ME1 and the light emitting elements LD, and the second auxiliary electrode AE2 may be located between the second alignment electrode ME2 and the light emitting elements LD. That is, the first auxiliary electrode AE1 may be located on one side of the light emitting elements LD, and the second auxiliary electrode AE2 may be located on another side of the light emitting elements LD. For example, the first auxiliary electrode AE1 may be adjacent to the second end portion EP2 of the light emitting elements LD, and the second auxiliary electrode AE2 may be adjacent to the first end portion EP1 of the light emitting elements LD. However, the disclosure is not limited thereto, and a shape, a mutual disposition relationship, and/or the like of the first and second auxiliary electrodes AE1 and AE2 may be variously changed.

A width of the first and second auxiliary electrodes AE1 and AE2 in the first direction (X-axis direction) may be different from a width of the first and second alignment electrodes ME1 and ME2 in the first direction (X-axis direction). For example, the width of the first and second auxiliary electrodes AE1 and AE2 in the first direction (X-axis direction) may be less than the width of the first and second alignment electrodes ME1 and ME2 in the first direction (X-axis direction), but the present disclosure is not limited thereto. For example, the width of the first and second auxiliary electrodes AE1 and AE2 in the first direction (X-axis direction) may be variously changed in consideration of a space in which the electrodes and the light emitting elements LD are located within the pixel PXL.

The first and second auxiliary electrodes AE1 and AE2 may receive an auxiliary signal (or auxiliary voltage) in an alignment operation of the light emitting elements LD. For example, the first and second auxiliary electrodes AE1 and AE2 may be electrically separated from the first and second alignment electrodes ME1 and ME2 to receive the auxiliary signal that is different from the alignment signal. As described above, when the auxiliary signal is supplied to the first and second auxiliary electrodes AE1 and AE2, even though a direction of the electric field by the alignment signal is changed, because the direction of the electric field may be maintained to be constant using the auxiliary signal, deflection alignment efficiency of the light emitting elements LD may be improved. For a detailed description of this, FIGS. 10 and 11 are referred.

Figure 10:
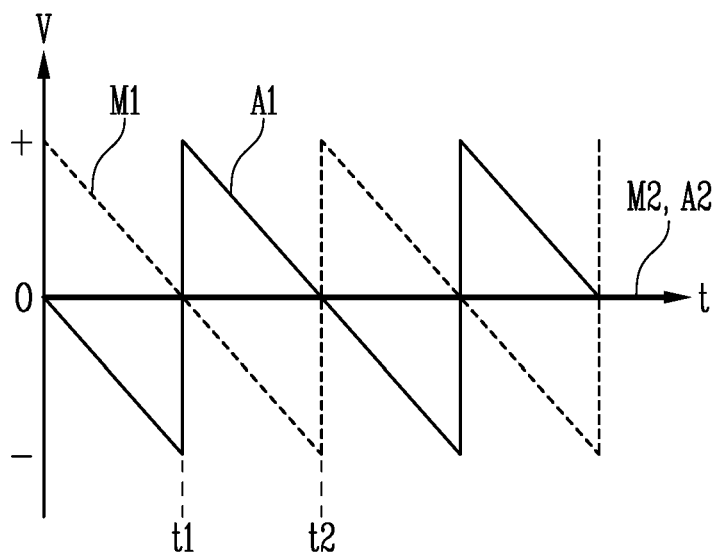
FIG. 10 illustrates an alignment signal and an auxiliary signal according to some embodiments.
Figure 11:
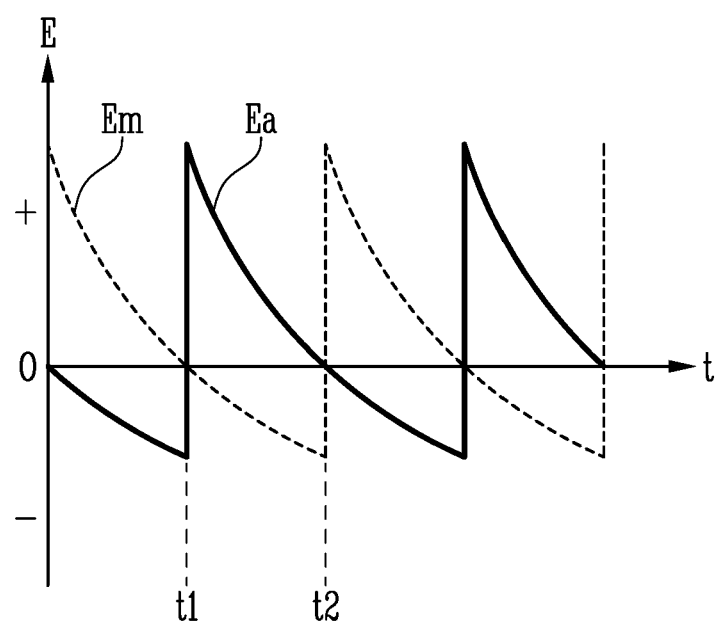
FIG. 11 illustrates characteristics of an electric field according to the alignment signal and the auxiliary signal of FIG. 10.

FIG. 10 illustrates an alignment signal and an auxiliary signal according to some embodiments, and FIG. 11 illustrates characteristics of an electric field according to the alignment signal and the auxiliary signal of FIG. 10.

Referring to FIGS. 10 and 11, a first alignment signal M1 may be supplied to the first alignment electrode ME1 and a second alignment signal M2 may be supplied to the second alignment electrode ME2. For example, the first alignment signal M1 may be an AC signal, and the second alignment signal M2 may be a DC signal. FIG. 10 illustrates a case where the first alignment signal M1 is an AC signal of an asymmetric waveform, and the second alignment signal M2 is a DC signal having a ground potential, but the present disclosure is not limited thereto.

When alignment signals (e.g., predetermined alignment signals) M1 and M2 are supplied to the first and second alignment electrodes ME1 and ME2, an electric field Em may be formed between the first and second alignment electrodes ME1 and ME2, and thus the light emitting elements LD may be aligned between the first and second alignment electrodes ME1 and ME2. At this time, a direction of the electric field Em by the alignment signals M1 and M2 may be periodically switched. For example, in FIG. 11, a sign, or polarity, of the electric field E means the direction of the electric field, and the electric field Em by the alignment signals M1 and M2 may be changed in an opposite direction based on a first time point t1. As described above, when the direction of the electric field Em is changed, a rotation direction of the light emitting elements LD may be changed according to the direction in which the electric field Em is formed. For example, in a first period 0 to t1, the light emitting elements LD may rotate in the forward direction and may be aligned in the forward direction. In a second period t1 to t2, the electric field Em may be formed in the opposite direction, and thus the light emitting elements LD may rotate in a reverse direction. Therefore, an alignment degree of the light emitting elements LD may be reduced. Accordingly, the display device according to some embodiments may supply auxiliary signals A1 and A2 to the first and second auxiliary electrodes AE1 and AE2, respectively, to reduce or minimize the rotation in the reverse direction of the light emitting elements LD during the second period t1 to t2.

A first auxiliary signal A1 may be supplied to the first auxiliary electrode AE1, and a second auxiliary signal A2 may be supplied to the second auxiliary electrode AE2. When the auxiliary signals (e.g., predetermined auxiliary signals) A1 and A2 are supplied to the first and second auxiliary electrodes AE1 and AE2, an electric field Ea may be formed between the first and second auxiliary electrodes AE1 and AE2, and thus the light emitting elements LD may be rotated and aligned.

As described above, in order to reduce or minimize the rotation of the light emitting elements LD in the reverse direction by the formation of the electric field Em in the opposite direction due to the alignment signals M1 and M2 during the second period t1 to t2, the first auxiliary signal A1 may be configured of a signal of a phase that is different from that of, or opposite to that of, the first alignment signal M1. For example, the first auxiliary signal A1 may be a signal having the same amplitude as the first alignment signal M1 but having a phase difference. For example, the first auxiliary signal A1 may be a signal generated by phase-modulating (for example, by sequentially phase-delaying) the first alignment signal M1 by 180° using a phase shifter. For example, when the first alignment signal M1 is set to a voltage of a negative polarity during the second period t1 to t2, the first auxiliary signal A1 may be set to a voltage of a positive polarity. Accordingly, even though the electric field Em by the alignment signals M1 and M2 is formed in the opposite direction during the second period t1 to t2, the electric field Ea may be formed so that the light emitting elements LD may rotate in the forward direction using the auxiliary signals A1 and A2.

In some embodiments, the first auxiliary signal A1 may be an AC signal, and the second auxiliary signal A2 may be a DC signal. The first auxiliary signal A1 may be an AC signal of an asymmetric waveform, and the second auxiliary signal A2 may be a DC signal having a ground potential. For example, as shown in FIG. 10, a time when the first auxiliary signal A1 is changed from about 0 to a maximum value during the second period t1 to t2, and a time when the first auxiliary signal A1 is changed from about 0 to a minimum value may be different. As described above, when the auxiliary signals A1 and A2 of the asymmetric waveform are applied, intensity and a direction of the electric field Ea by the auxiliary signals A1 and A2 may be asymmetrically formed. Therefore, as shown in FIG. 11, even though the electric field Em by the alignment signals M1 and M2 is formed in the opposite direction during the second period t1 to t2, the electric field Ea may be formed so that the light emitting elements LD may rotate in the forward direction by adjusting the direction and the intensity of the electric field Ea by applying the auxiliary signals A1 and A2 of the asymmetric waveform. That is, because the rotation of the light emitting elements LD in the reverse direction during the second period t1 to t2 may be reduced or minimized, the deflection alignment efficiency of the light emitting elements LD may be improved.

Referring to FIG. 5 again, the pixel PXL according to some embodiments may further include connection electrodes CE1 and CE2 that respectively electrically connect the alignment electrodes ME1 and ME2 and the light emitting elements LD. The first connection electrode CE1 may be located on the first alignment electrode ME1 and the second end portion EP2 of the light emitting elements LD, and may be in contact with the first alignment electrode ME1 and the second end portion EP2 of the light emitting elements LD. That is, the first connection electrode CE1 may electrically connect the first alignment electrode ME1 and the light emitting elements LD. The second connection electrode CE2 may be located on the second alignment electrode ME2 and the first end portion EP1 of the light emitting elements LD, and may be in contact with the second alignment electrode ME2 and the first end portion EP1 of the light emitting elements LD. That is, the second connection electrode CE2 may electrically connect the second alignment electrode ME2 and the light emitting elements LD. The first and second connection electrodes CE1 and CE2 may extend along the second direction (Y-axis direction), but are not limited thereto.

According to some embodiments, the pixel PXL may further include bank patterns BNP that at least partially overlap the first and second alignment electrodes ME1 and ME2. The bank patterns BNP may be located to be spaced apart from each other in each pixel PXL, and may respectively protrude from one region of each of the first and second alignment electrodes ME1 and ME2 in a front, or forward, direction of the display panel PNL, that is, in a third direction (Z-axis direction).

Hereinafter, a cross-sectional structure of each pixel PXL is described in detail with reference to FIGS. 6 to 9, centering on the light emitting element LD. FIGS. 6 to 9 illustrate a transistor T (for example, the first transistor T1 of FIG. 4) among various circuit elements configuring the pixel circuit PXC. Hereinafter, when it is not necessary to specify the first transistor T1 separately, the first transistor T1 may also be collectively referred to as the "transistor T." Meanwhile, a structure, a position of each layer, and/or the like of the transistors T are/is not limited to the embodiments of FIGS. 6 to 9, and may be variously changed according to some embodiments. In addition, the transistors T configuring each pixel circuit PXC may have substantially the same or similar structure, but are not limited thereto. For example, in other embodiments, at least one of the transistors T configuring the pixel circuit PXC may have a cross-sectional structure that is different from that of the other transistors T, and/or may be located on a layer that is different from that of the other transistors T.

Figure 6:
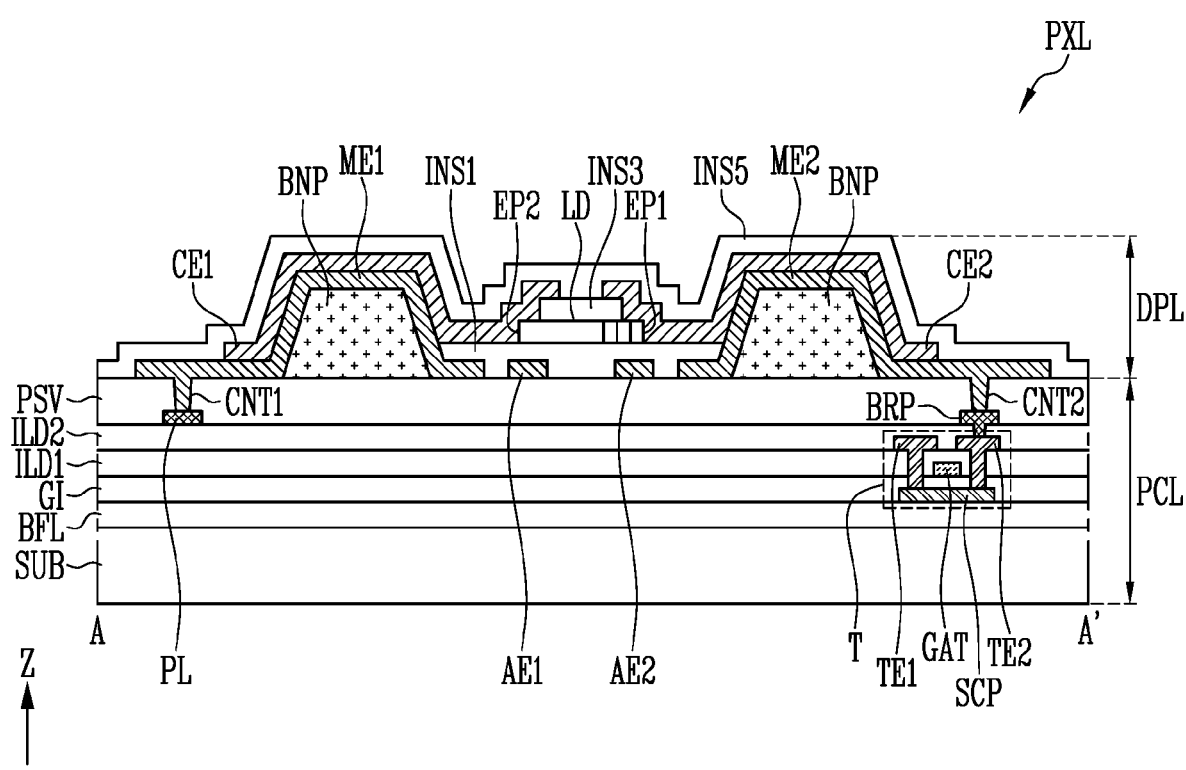
FIGS. 6 to 9 are cross-sectional views taken along the line A-A' of FIG. 5.

Referring to FIG. 6, the pixel PXL and the display device including the same may include the substrate SUB, a circuit layer PCL located on the substrate SUB, and a display layer DPL located on the circuit layer PCL. The circuit layer PCL may include the transistors T configuring the pixel circuit PXC of each pixel PXL, and insulating layers located between circuit elements.

For example, the substrate SUB may configure a base member, and may be a rigid or flexible substrate or film. For example, the substrate SUB may be a rigid substrate formed of glass or tempered glass, a flexible substrate (or a thin film) formed of a plastic or metal material, or an insulating layer of at least one layer. A material and/or a physical property of the substrate SUB are/is not limited. In some embodiments, the substrate SUB may be substantially transparent. Here, "substantially transparent" may mean that light may be transmitted at a transmittance (e.g., a predetermined transmittance) or more. In other embodiments, the substrate SUB may be translucent or opaque. In addition, the substrate SUB may include a reflective material according to some embodiments.

Each of the transistors T may include a semiconductor pattern SCP, a gate electrode GAT, and first and second transistor electrodes TE1 and TE2. Meanwhile, in FIG. 6, embodiments in which the transistor T includes the first and second transistor electrodes TE1 and TE2 formed separately from the semiconductor pattern SCP is shown, but the present disclosure is not limited thereto. For example, in other embodiments, the first and/or second transistor electrodes TE1 and TE2 provided in at least one transistor T may be integrated with each of the semiconductor patterns SCP.

A buffer layer BFL may be located on the substrate SUB. The buffer layer BFL may reduce or prevent impurities from being diffused into the circuit elements. The buffer layer BFL may be configured of a single layer, but may be configured of multiple layers of at least two or more layers. When the buffer layer BFL is formed of multiple layers, each layer may be formed of the same material, or may be formed of different materials.

The semiconductor pattern SCP may be located on the buffer layer BFL. For example, each of the semiconductor patterns SCP may include a first region that is in contact with the first transistor electrode TE1, a second region that is in contact with the second transistor electrode TE2, and a channel region positioned between the first and second regions. According to some embodiments, one of the first and second regions may be a source region, and the other may be a drain region.

According to some embodiments, the semiconductor pattern SCP may be formed of polysilicon, amorphous silicon, oxide semiconductor, or the like. In addition, the channel region of the semiconductor pattern SCP may a semiconductor pattern that is not doped with an impurity, and may be an intrinsic semiconductor. Each of the first and second regions of the semiconductor pattern SCP may be a semiconductor doped with an impurity (e.g., a predetermined impurity).

A gate insulating layer GI may be located on the semiconductor pattern SCP. For example, the gate insulating layer GI may be located between the semiconductor pattern SCP and the gate electrode GAT. The gate insulating layer GI may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The gate electrode GAT may be located on the gate insulating layer GI. The gate electrode GAT may be located to overlap the semiconductor pattern SCP in the third direction (Z-axis direction) on the gate insulating layer GI.

A first interlayer insulating layer ILD1 may be located on the gate electrode GAT. For example, the first interlayer insulating layer ILD1 may be located between the gate electrode GAT and the first and second transistor electrodes TE1 and TE2. The first interlayer insulating layer ILD1 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The first and second transistor electrodes TE1 and TE2 may be located on the first interlayer insulating layer ILD1. The first and second transistor electrodes TE1 and TE2 may be located to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole passing through the first interlayer insulating layer ILD1 and the gate insulating layer GI. The second transistor electrode TE2 may be electrically connected to the second region of the semiconductor pattern SCP through a contact hole passing through the first interlayer insulating layer ILD1 and the gate insulating layer GI. According to some embodiments, one of the first and second transistor electrodes TE1 and TE2 may be a source electrode, and the other may be a drain electrode.

A second interlayer insulating layer ILD2 may be located on the first and second transistor electrodes TE1 and TE2. The second interlayer insulating layer ILD2 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A power line PL and/or a bridge pattern BRP may be located on the second interlayer insulating layer ILD2. The power line PL may be formed of the same conductive layer as the bridge pattern BRP. That is, the power line PL and the bridge pattern BRP may be concurrently or substantially simultaneously formed in the same process, but are not limited thereto. The power line PL may configure the second power line PL2 described with reference to FIG. 4. The bridge pattern BRP may be electrically connected to the second transistor electrode TE2 through a contact hole passing through the second interlayer insulating layer ILD2.

A protective layer PSV may be located on the circuit elements including the transistors T. The protective layer PSV may be formed of an organic material to flatten a lower step difference. For example, the protective layer PSV may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the protective layer PSV may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The display layer DPL may be located on the protective layer PSV of the circuit layer PCL. The display layer DPL may include the bank pattern BNP, the first and second alignment electrodes ME1 and ME2, the light emitting elements LD, the first and second auxiliary electrodes AE1 and AE2, and the first and second connection electrodes CE1 and CE2.

The bank pattern BNP may be located on the protective layer PSV. The bank pattern BNP may have various shapes according to some embodiments. In some embodiments, the bank pattern BNP may have a shape protruding from the substrate SUB in the third direction (Z-axis direction). In addition, the bank pattern BNP may be formed to have an inclined surface that is inclined at an angle (e.g., a predetermined angle) with respect to the substrate SUB. However, the disclosure is not limited thereto, and the bank pattern BNP may have a curved shape, or a sidewall of a step shape, or the like. For example, the bank pattern BNP may have a cross section of a semicircle shape, semi-ellipse shape, or the like.

Electrodes and insulating layers located on the bank pattern BNP may have a shape corresponding to the bank pattern BNP. For example, the first and second alignment electrodes ME1 and ME2 located on the bank pattern BNP may include an inclined surface or a curved surface having a shape corresponding to the shape of the bank pattern BNP. Accordingly, the bank pattern BNP may function as a reflective member that improves a light emission efficiency of the display panel PNL by guiding the light emitted from the light emitting elements LD in the front/forward direction, that is, the third direction (Z-axis direction) of the pixel PXL together with the first and second alignment electrodes ME1 and ME2 provided thereon.

The bank pattern BNP may include at least one organic material and/or inorganic material. For example, the bank pattern BNP may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the bank pattern BNP may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The first and second alignment electrodes ME1 and ME2 may be located on the protective layer PSV and the bank pattern BNP. The first and second alignment electrodes ME1 and ME2 may be located to be spaced apart from each other. As described above, the first and second alignment electrodes ME1 and ME2 may receive the alignment signal in the operation of aligning the light emitting elements LD. Accordingly, the electric field may be formed between the first and second alignment electrodes ME1 and ME2, and thus the light emitting elements LD supplied to each of the pixels PXL may be aligned between the first and second alignment electrodes ME1 and ME2.

The first alignment electrode ME1 may be electrically connected to the power line PL through a first contact hole CNT1 passing through the protective layer PSV. The second alignment electrode ME2 may be electrically connected to the bridge pattern BRP through a second contact hole CNT2 passing through the protective layer PSV, and may be electrically connected to the second transistor electrode TE2 through the bridge pattern BRP.

Each of the first and second alignment electrodes ME1 and ME2 may include at least one conductive material. For example, the first and second alignment electrodes ME1 and ME2 may include at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu) or an alloy including the at least one metal, a conductive oxide such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), or fluorine tin oxide (FTO), and/or at least one conductive material among conductive polymers such as PEDOT, but the present disclosure is not limited thereto.

The first and second auxiliary electrodes AE1 and AE2 may be located on the protective layer PSV. In some embodiments, the first and second auxiliary electrodes AE1 and AE2 may be located on the same layer as the first and second alignment electrodes ME1 and ME2. That is, the first and second auxiliary electrodes AE1 and AE2 may be formed of the same conductive layer as the first and second alignment electrodes ME1 and ME2. The first and second auxiliary electrodes AE1 and AE2 and the first and second alignment electrodes ME1 and ME2 may be concurrently or substantially simultaneously formed in the same process, but are not limited thereto.

A first insulating layer INS1 may be located on the first and second alignment electrodes ME1 and ME2 and the first and second auxiliary electrodes AE1 and AE2. The first insulating layer INS1 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

Meanwhile, a cross-sectional disposition of the first and second alignment electrodes ME1 and ME2 and the first and second auxiliary electrodes AE1 and AE2 is not limited thereto, and may be variously changed in other embodiments.

Figure 7:
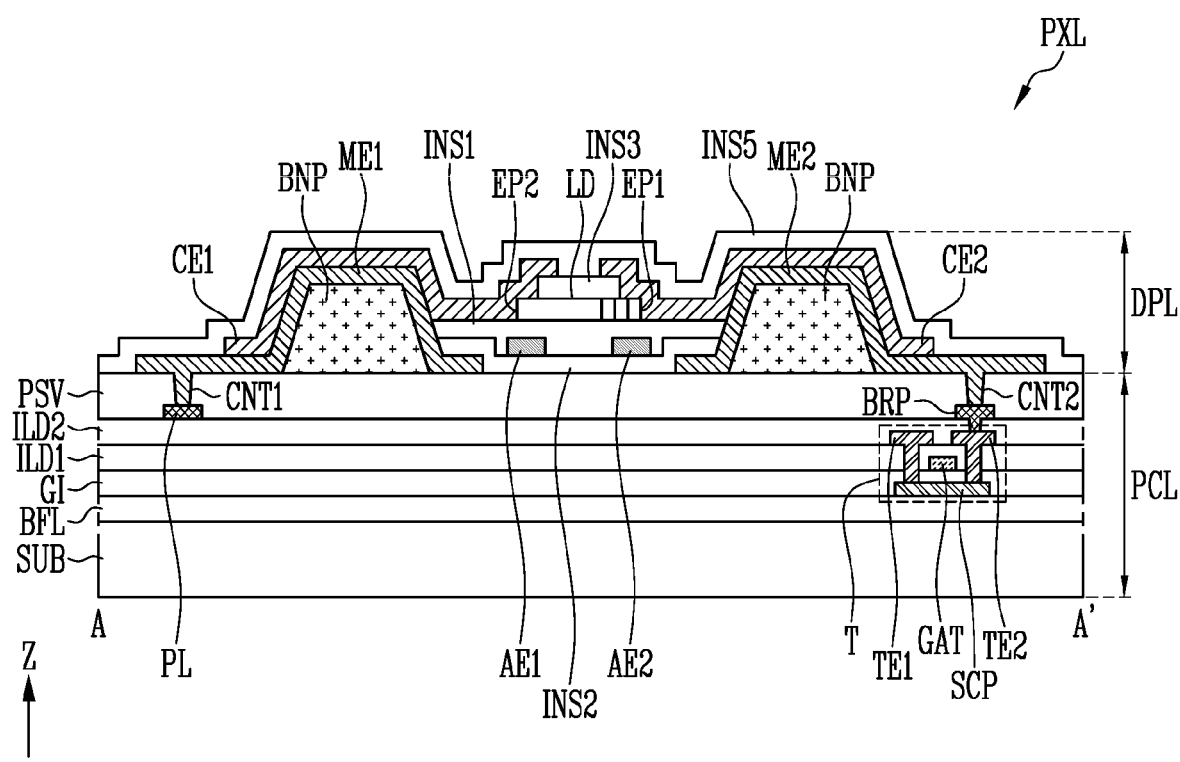
Figure 8:
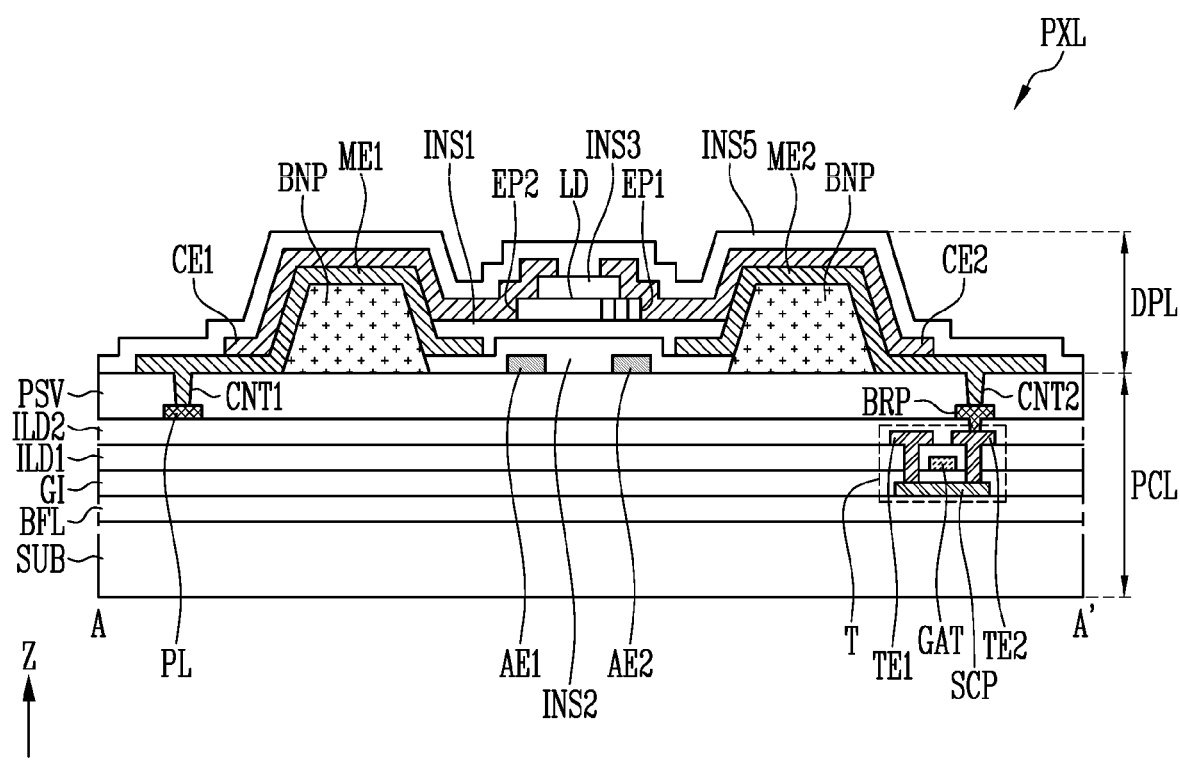

For example, the first and second alignment electrodes ME1 and ME2 and the first and second auxiliary electrodes AE1 and AE2 may be located on different layers. As shown in FIG. 7, the first and second alignment electrodes ME1 and ME2 may be located on the protective layer PSV, and the first and second auxiliary electrodes AE1 and AE2 may be located on the first and second alignment electrodes ME1 and ME2 (e.g., on a layer that is above the layer on which the first and second auxiliary electrodes AE1 and AE2 are located). Alternatively, as shown in FIG. 8, the first and second auxiliary electrodes AE1 and AE2 may be located on the protective layer PSV, and the first and second alignment electrodes ME1 and ME2 may be located on the first and second auxiliary electrodes AE1 and AE2 (e.g., on a layer that is above the layer on which the first and second alignment electrodes ME1 and ME2 are located). As described above, when the first and second alignment electrodes ME1 and ME2 and the first and second auxiliary electrodes AE1 and AE2 are formed of different conductive layers, a second insulating layer INS2 may be further located between the first and second alignment electrodes ME1 and ME2 and the first and second auxiliary electrodes AE1 and AE2. The second insulating layer INS2 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The light emitting elements LD may be located on the first insulating layer INS1. The light emitting elements LD may be located between the first and second alignment electrodes ME1 and ME2 (e.g., in a plan view) on the first insulating layer INS1. In addition, the light emitting elements LD may be located between the first and second auxiliary electrodes AE1 and AE2 (e.g., partially, and in a plan view) on the first insulating layer INS1.

The light emitting elements LD may be prepared in a dispersed form in a solution (e.g., a predetermined solution), and may be supplied to each of the pixels PXL through an inkjet printing method or the like. For example, the light emitting elements LD may be dispersed in a volatile solvent and provided in an emission area of each of the pixels PXL. In a process of aligning the light emitting elements LD, when the alignment signal is supplied through the first and second alignment electrodes ME1 and ME2, as the electric field is formed between the first and second alignment electrodes ME1 and ME2, the light emitting elements LD may be aligned between the first and second alignment electrodes ME1 and ME2. At this time, even though the electric field by the alignment signal is formed in the opposite direction, the electric field may be formed so that the light emitting elements LD may rotate in the forward direction by supplying the auxiliary signal through the first and second auxiliary electrodes AE1 and AE2. That is, as described above, the deflection alignment efficiency of the light emitting elements LD may be improved by using the first and second auxiliary electrodes AE1 and AE2.

After the light emitting elements LD are aligned, the solvent may be volatilized or removed in other methods to stably arrange the light emitting elements LD between the first and second alignment electrodes ME1 and ME2.

A third insulating layer INS3 may be located on the light emitting elements LD. The third insulating layer INS3 may be partially located on the light emitting elements LD. When the third insulating layer INS3 is formed on the light emitting elements LD after the alignment of the light emitting elements LD is completed, the light emitting elements LD deviation from an aligned position may be reduced or prevented. The third insulating layer INS3 may be located on the light emitting elements LD, and may expose the first and second end portions EP1 and EP2 of the light emitting elements LD.

The third insulating layer INS3 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The first and second connection electrodes CE1 and CE2 may be respectively located on the first and second end portions EP1 and EP2 of the light emitting elements LD exposed by the third insulating layer INS3. The first connection electrode CE1 may be located on the second end portion EP2 of the light emitting element LD. The first connection electrode CE1 may contact the second end portion EP2 of the light emitting element LD exposed by the third insulating layer INS3. In addition, the first connection electrode CE1 may be located on the first alignment electrode ME1. The first connection electrode CE1 may contact the first alignment electrode ME1 exposed by the first insulating layer INS1. That is, the first connection electrode CE1 may electrically connect the light emitting element LD and the first alignment electrode ME1. In addition, the first connection electrode CE1 may be electrically separated from the first auxiliary electrode AE1. Accordingly, the first auxiliary electrode AE1 may be electrically separated from the first alignment electrode ME1 and/or the light emitting elements LD, but the present disclosure is not limited thereto.

The second connection electrode CE2 may be located on the first end portion EP1 of the light emitting element LD. The second connection electrode CE2 may contact the first end portion EP1 of the light emitting element LD exposed by the third insulating layer INS3. In addition, the second connection electrode CE2 may be located on the second alignment electrode ME2. The second connection electrode CE2 may contact the second alignment electrode ME2 exposed by the first insulating layer INS1. That is, the second connection electrode CE2 may electrically connect the light emitting element LD and the second alignment electrode ME2. In addition, the second connection electrode CE2 may be electrically separated from the second auxiliary electrode AE2. Accordingly, the second auxiliary electrode AE2 may be electrically separated from the second alignment electrode ME2 and/or the light emitting elements LD, but the present disclosure is not limited thereto.

In some embodiments, the first and second connection electrodes CE1 and CE2 may be located on the same layer. That is, the first and second connection electrodes CE1 and CE2 may be formed of the same conductive layer. The first and second connection electrodes CE1 and CE2 may be concurrently or substantially simultaneously formed in the same process, but are not limited thereto.

Figure 9:
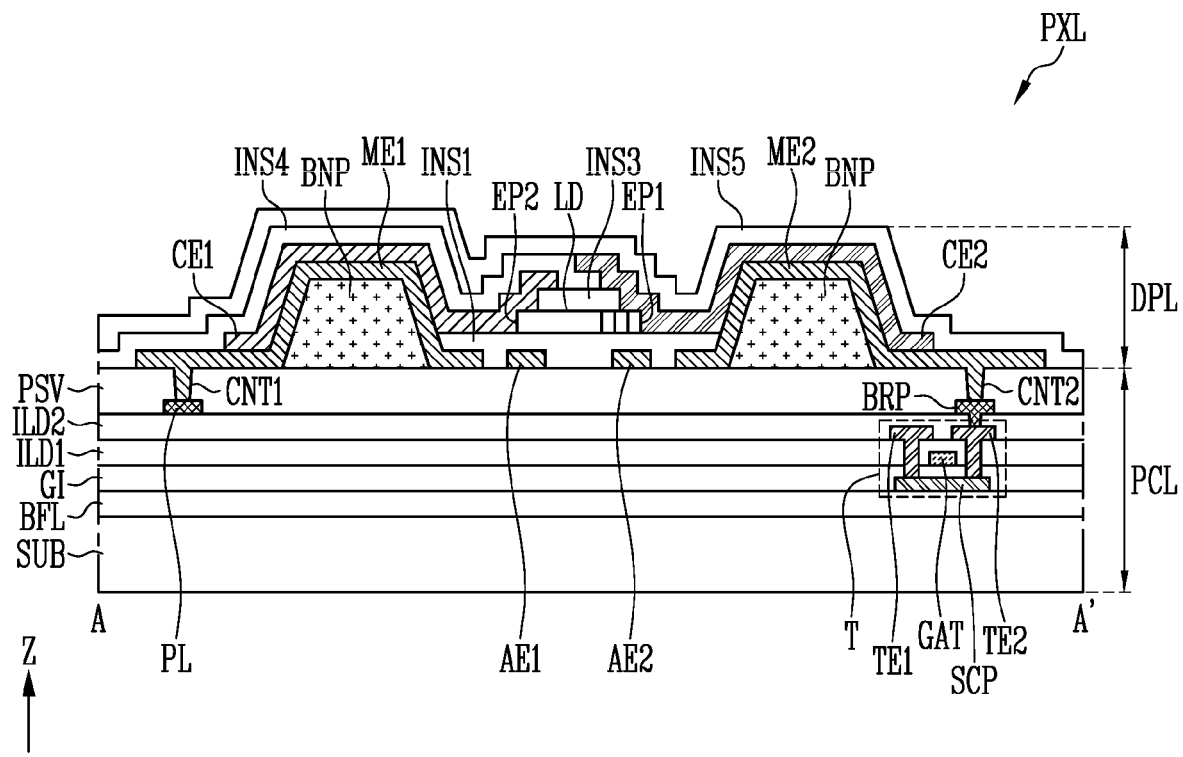

In other embodiments, the first and second connection electrodes CE1 and CE2 may be located on different layers. For example, as shown in FIG. 9, the first connection electrode CE1 may be located on the third insulating layer INS3, and the second connection electrode CE2 may be located on the first connection electrode CE1. As described above, when the first and second connection electrodes CE1 and CE2 are formed of different conductive layers, a fourth insulating layer INS4 may be further located between the first connection electrode CE1 and the second connection electrode CE2. The fourth insulating layer INS4 may cover the first connection electrode CE1 and may expose the first end portion EP1 of the light emitting element LD. The second connection electrode CE2 may be located on the first end portion EP1 of the light emitting element LD exposed by the fourth insulating layer INS4. As described above, when the fourth insulating layer INS4 is located between the connection electrodes CE1 and CE2 formed of different conductive layers, the connection electrodes CE1 and CE2 may be stably separated from each other by the third insulating layer INS3, and thus electrical stability between the first and second end portions EP1 and EP2 of the light emitting elements LD may be secured. Accordingly, the likelihood of a short defect may be effectively reduced or prevented from occurring between the first and second end portions EP1 and EP2 of the light emitting elements LD.

Each of the first and second connection electrodes CE1 and CE2 may be configured of various transparent conductive materials. For example, the first and second connection electrodes CE1 and CE2 may include at least one of various transparent conductive materials including indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), or fluorine tin oxide (FTO), and may be implemented to be substantially transparent or translucent to satisfy a level of light transmittance (e.g., a predetermined light transmittance). Accordingly, the light emitted from the first and second end portions EP1 and EP2 of the light emitting elements LD may pass through the first and second connection electrodes CE1 and CE2, and may be emitted to the outside of the display panel PNL.

The fourth insulating layer INS4 may be configured of a single layer or of multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A fifth insulating layer INS5 may be located on the first and second connection electrodes CE1 and CE2. The fifth insulating layer INS5 may cover the first and second connection electrodes CE1 and CE2, the light emitting elements LD, the first and second alignment electrodes ME1 and ME2, and the first and second auxiliary electrodes AE1 and AE2 located under the fifth insulating layer INS5. The fifth insulating layer INS5 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

In accordance with the display device according to the embodiments described above, even though the electric field Em corresponding to the alignment signals M1 and M2 supplied to the alignment electrodes ME1 and ME2 is formed in the opposite direction, the electric field Ea may be formed so that the light emitting elements LD rotate in the forward direction by supplying the auxiliary signals A1 and A2 through the auxiliary electrodes AE1 and AE2. That is, because the rotation of the light emitting elements LD in the reverse direction during the period in which the electric field Em by the alignment signals M1 and M2 is formed in the opposite direction may be reduced or minimized, the deflection alignment efficiency of the light emitting elements LD may be improved.

Hereinafter, other embodiments are described. In the following embodiments, the same component as that previously described is referred to by the same reference numeral, and a repetitive description is omitted or simplified.

Figure 12:
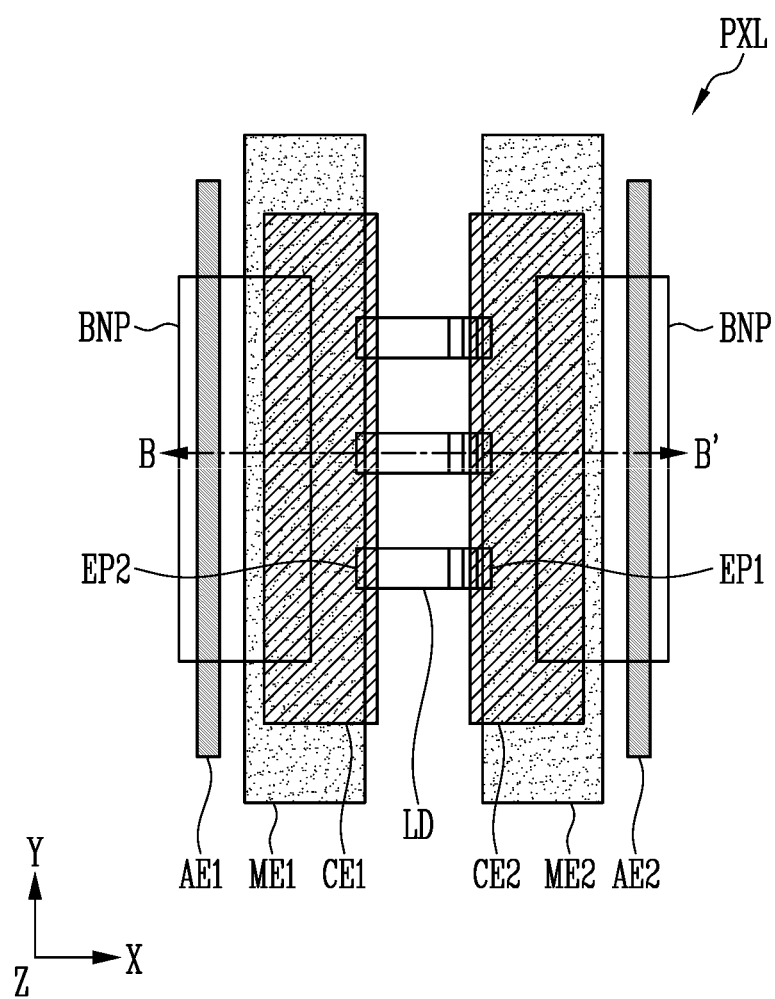
FIG. 12 is a plan view illustrating a pixel according to other embodiments.
Figure 13:
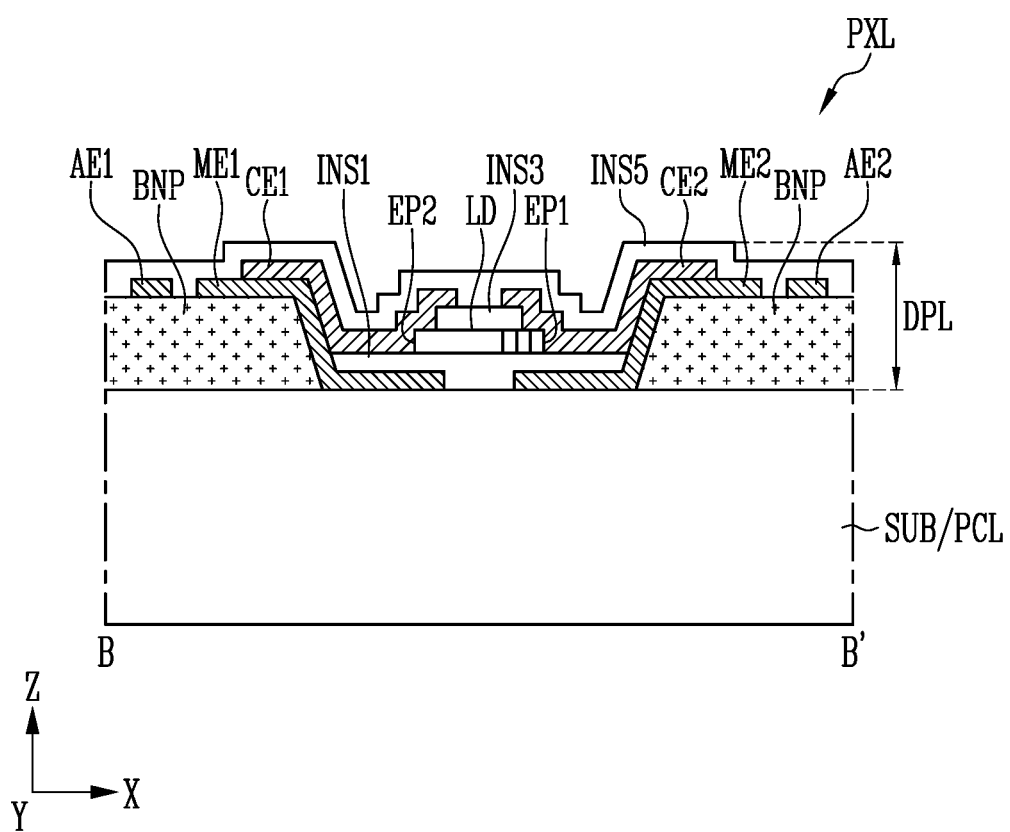
FIG. 13 is a cross-sectional view taken along the line B-B' of FIG. 12.

FIG. 12 is a plan view illustrating a pixel according to other embodiments, and FIG. 13 is a cross-sectional view taken along the line B-B' of FIG. 12. Hereinafter, for convenience of description, the circuit layer PCL is omitted from the cross-sectional view.

Referring to FIGS. 12 and 13, the display device according to some embodiments is distinguished from the embodiments of FIGS. 1 to 11 in that the alignment electrodes ME1 and ME2 are located between the auxiliary electrodes AE1 and AE2.

For example, the first and second alignment electrodes ME1 and ME2 may be located between the first auxiliary electrode AE1 and the second auxiliary electrode AE2. For example, the first and second alignment electrodes ME1 and ME2 may be respectively located on one side and the other side of the light emitting elements LD between the first auxiliary electrode AE1 and the second auxiliary electrode AE2. For example, the first alignment electrode ME1 may be located between the first auxiliary electrode AE1 and the light emitting elements LD, and the second alignment electrode ME2 may be located between the second auxiliary electrode AE2 and the light emitting elements LD. The first and second alignment electrodes ME1 and ME2 and the first and second auxiliary electrodes AE1 and AE2 may be separated and spaced apart from each other.

The first and second auxiliary electrodes AE1 and AE2 may at least partially overlap the bank patterns BNP. For example, the first and second auxiliary electrodes AE1 and AE2 may be located on the bank patterns BNP. In some embodiments, the first and second auxiliary electrodes AE1 and AE2 may be located on the same layer as the first and second alignment electrodes ME1 and ME2. However, the disclosure is not limited thereto, and as described with reference to FIGS. 7 and 8, the first and second auxiliary electrodes AE1 and AE2 and the first and second alignment electrodes ME1 and ME2 may be configured of different respective conductive layers.

In addition, because a detailed description of the alignment electrodes ME1 and ME2 and the auxiliary electrodes AE1 and AE2 is described above with reference to FIGS. 1 to 11, repetitive description is omitted.

Figure 14:
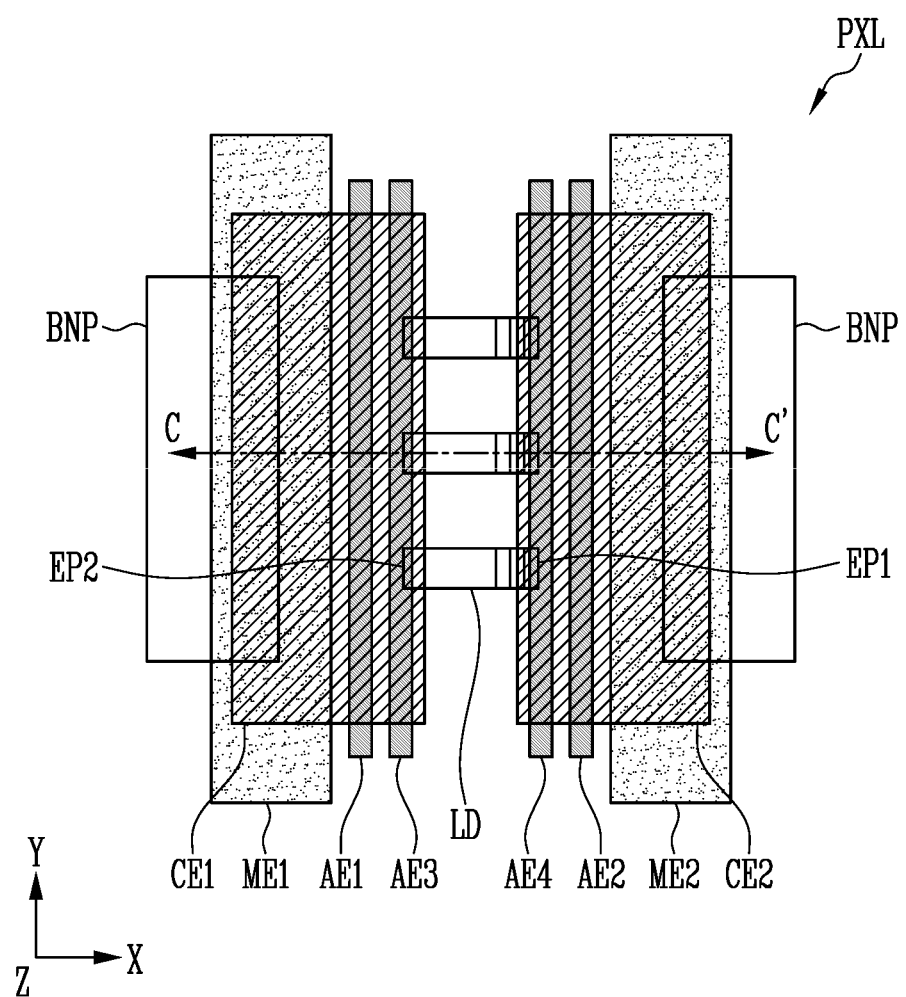
FIG. 14 is a plan view illustrating a pixel according to still other embodiments.
Figure 15:
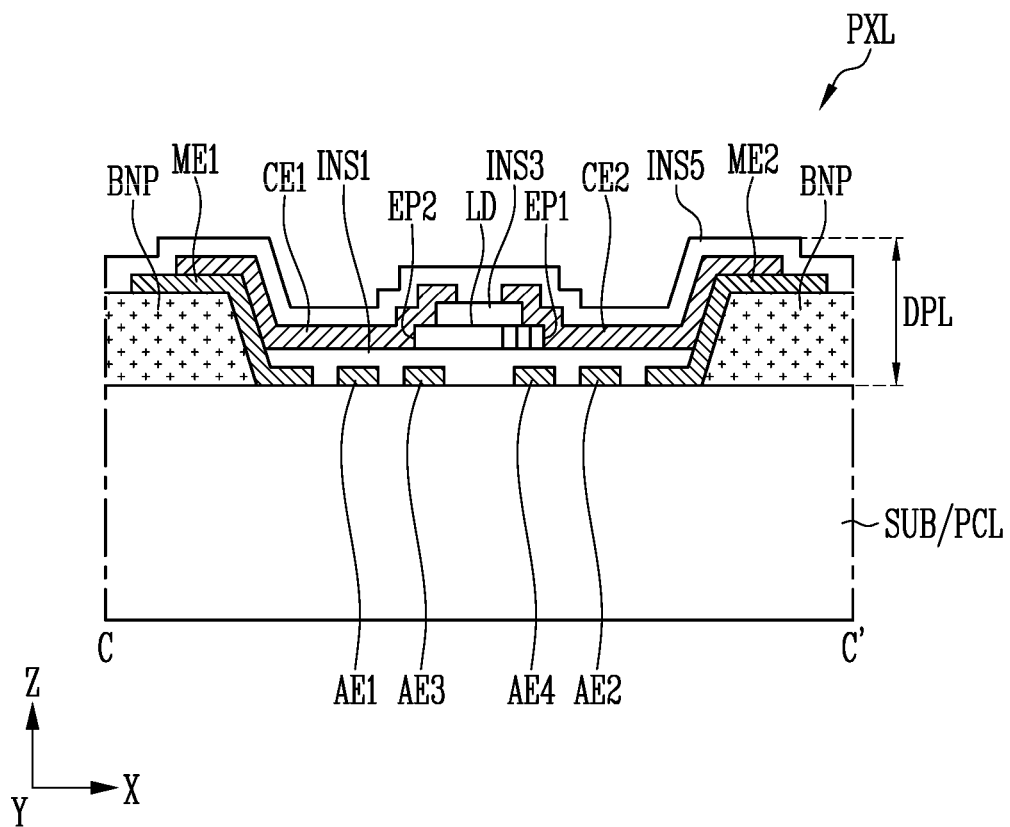
FIG. 15 is a cross-sectional view taken along the line C-C' of FIG. 14.

FIG. 14 is a plan view illustrating a pixel according to still other embodiments, and FIG. 15 is a cross-sectional view taken along the line C-C' of FIG. 14.

Referring to FIGS. 14 and 15, the display device according to some embodiments is distinguished from the embodiments of FIGS. 1 to 11 in that the display device further includes a third auxiliary electrode AE3 and a fourth auxiliary electrode AE4.

For example, each of the third and fourth auxiliary electrodes AE3 and AE4 may extend in the second direction (Y-axis direction), and may be located to be spaced apart from each other along the first direction (X-axis direction). The third and fourth auxiliary electrodes AE3 and AE4 may be separated and spaced apart from the first and second auxiliary electrodes AE1 and AE2 and/or the first and second alignment electrodes ME1 and ME2. That is, the third and fourth auxiliary electrodes AE3 and AE4 may be electrically separated from the first and second auxiliary electrodes AE1 and AE2 and/or the first and second alignment electrodes ME1 and ME2.

In some embodiments, the third and fourth auxiliary electrodes AE3 and AE4 may be located between the first alignment electrode ME1 and the second alignment electrode ME2. In addition, the third and fourth auxiliary electrodes AE3 and AE4 may be located between the first auxiliary electrode AE1 and the second auxiliary electrode AE2. The third auxiliary electrode AE3 may be located between the first auxiliary electrode AE1 and the light emitting elements LD, and the fourth auxiliary electrode AE4 may be located between the second auxiliary electrode AE2 and the light emitting elements LD. That is, the third auxiliary electrode AE3 may be located on one side of the light emitting elements LD, and the fourth auxiliary electrode AE4 may be located on the other side of the light emitting elements LD. For example, the third auxiliary electrode AE3 may be adjacent to the second end portion EP2 of the light emitting elements LD, and the fourth auxiliary electrode AE4 may be adjacent to the first end portion EP1 of the light emitting elements LD. However, the disclosure is not limited thereto, and a shape, a mutual disposition relationship, and/or the like of the third and fourth auxiliary electrodes AE3 and AE4 may be variously changed.

A width of the third and fourth auxiliary electrodes AE3 and AE4 in the first direction (X-axis direction) may be different from the width of the first and second alignment electrodes ME1 and ME2 in the first direction (X-axis direction). For example, the width of the third and fourth auxiliary electrodes AE3 and AE4 in the first direction (X-axis direction) may be less than the width of the first and second alignment electrodes ME1 and ME2 in the first direction (X-axis direction), but the present disclosure is not limited thereto. In addition, the width of the third and fourth auxiliary electrodes AE3 and AE4 in the first direction (X-axis direction) may be substantially the same as the width of the first and second auxiliary electrodes AE1 and AE2 in the first direction (X-axis direction), but the present disclosure is not limited thereto. For example, the width of the third and fourth auxiliary electrodes AE3 and AE4 in the first direction (X-axis direction) may be variously changed in consideration of the space in which the electrodes and the light emitting elements LD are located within the pixel PXL.

The third and fourth auxiliary electrodes AE3 and AE4 may be located on the protective layer PSV. The third and fourth auxiliary electrodes AE3 and AE4 may be located between the protective layer PSV and the first insulating layer INS1. For example, the third and fourth auxiliary electrodes AE3 and AE4 may be located on the same layer as the first and second auxiliary electrodes AE1 and AE2. That is, the third and fourth auxiliary electrodes AE3 and AE4 may be formed of the same conductive layer as the first and second auxiliary electrodes AE1 and AE2. The third and fourth auxiliary electrodes AE3 and AE4 and the first and second auxiliary electrodes AE1 and AE2 may be concurrently or substantially simultaneously formed in the same process, but are not limited thereto. For example, the third and fourth auxiliary electrodes AE3 and AE4 may be configured of a conductive layer that is different from that of the first and second auxiliary electrodes AE1 and AE2, and an insulating layer may be located between the third and fourth auxiliary electrodes AE3 and AE4 and the first and second auxiliary electrodes AE1 and AE2.

In addition, the third and fourth auxiliary electrodes AE3 and AE4 may be located on the same layer as the first and second alignment electrodes ME1 and ME2. That is, the third and fourth auxiliary electrodes AE3 and AE4 may be formed of the same conductive layer as the first and second alignment electrodes ME1 and ME2. The third and fourth auxiliary electrodes AE3 and AE4 and the first and second alignment electrodes ME1 and ME2 may be concurrently or substantially simultaneously formed in the same process, but are not limited thereto. For example, the third and fourth auxiliary electrodes AE3 and AE4 may be configured of a conductive layer that is different from that of the first and second alignment electrodes ME1 and ME2, and an insulating layer may be located between the third and fourth auxiliary electrodes AE3 and AE4 and the first and second alignment electrodes ME1 and ME2. That is, a cross-sectional disposition of the third and fourth auxiliary electrodes AE3 and AE4 may be variously changed.

The third and fourth auxiliary electrodes AE3 and AE4 may receive the auxiliary signal (or auxiliary voltage) together with the first and second auxiliary electrodes AE1 and AE2 in the alignment operation of the light emitting elements LD. For example, the third and fourth auxiliary electrodes AE3 and AE4 may be electrically separated from the first and second auxiliary electrodes AE1 and AE2 to receive different auxiliary signals. For a detailed description of this, FIGS. 16 and 17 are referred.

Figure 16:
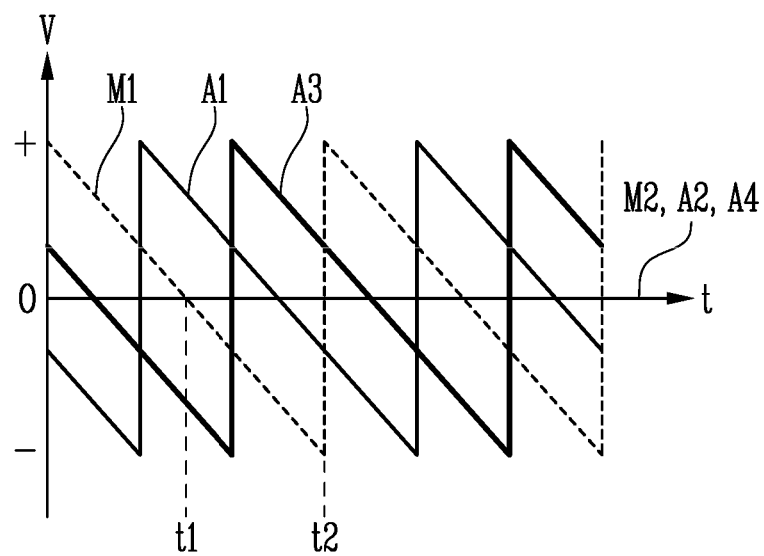
FIG. 16 illustrates an alignment signal and an auxiliary signal according to some embodiments.
Figure 17:
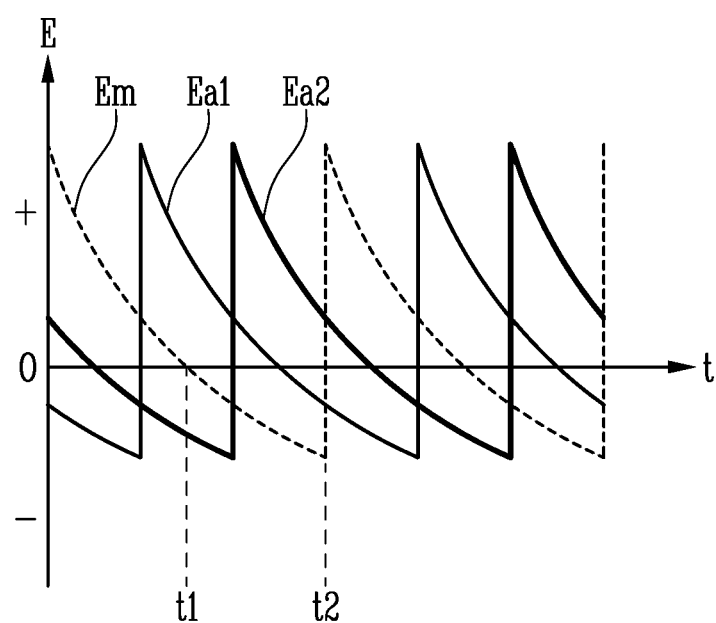
FIG. 17 illustrates characteristics of an electric field according to the alignment signal and the auxiliary signal of FIG. 16.

FIG. 16 illustrates an alignment signal and an auxiliary signal according to some embodiments, and FIG. 17 illustrates characteristics of an electric field according to the alignment signal and the auxiliary signal of FIG. 16.

Referring to FIGS. 16 and 17, the first alignment signal M1 may be supplied to the first alignment electrode ME1 and a second alignment signal M2 may be supplied to the second alignment electrode ME2. For example, the first alignment signal M1 may be an AC signal, and the second alignment signal M2 may be a DC signal. FIG. 16 illustrates a case where the first alignment signal M1 is an AC signal of an asymmetric waveform and the second alignment signal M2 is a DC signal having a ground potential, but the present disclosure is not limited thereto.

When alignment signals (e.g., predetermined alignment signals) M1 and M2 are supplied to the first and second alignment electrodes ME1 and ME2, an electric field Em may be formed between the first and second alignment electrodes ME1 and ME2, and thus the light emitting elements LD may be aligned between the first and second alignment electrodes ME1 and ME2. At this time, a direction of the electric field Em by the alignment signals M1 and M2 may be periodically switched, and a rotation direction of the light emitting elements LD may be changed according to the direction of the electric field Em. For example, in a first period 0 to t1, the light emitting elements LD may rotate in the forward direction and may be aligned in the forward direction. In a second period t1 to t2, the electric field Em may be formed in the opposite direction, and thus the light emitting elements LD may rotate in a reverse direction. Therefore, an alignment degree of the light emitting elements LD may be reduced. Accordingly, the display device according to some embodiments may supply auxiliary signals A1 to A4 to first to fourth auxiliary electrodes AE1, AE2, AE3, and AE4, respectively, to reduce or minimize the rotation in the reverse direction of the light emitting elements LD during the second period t1 to t2.

A first auxiliary signal A1 may be supplied to the first auxiliary electrode AE1, and a second auxiliary signal A2 may be supplied to the second auxiliary electrode AE2. In addition, a third auxiliary signal A3 may be supplied to the third auxiliary electrode AE3 and a fourth auxiliary signal A4 may be supplied to the fourth auxiliary electrode AE4.

For example, the first auxiliary signal A1 and/or the third auxiliary signal A3 may be an AC signal, and the second auxiliary signal A2 and/or the fourth auxiliary signal A4 may be a DC signal. FIG. 16 illustrates a case where the first auxiliary signal A1 and/or the third auxiliary signal A3 are/is an AC signal of an asymmetric waveform, and the second auxiliary signal A2 and/or the fourth auxiliary signal A4 are/is a DC signal having a ground potential, but the present disclosure is not limited thereto.

When auxiliary signals (e.g., predetermined auxiliary signals) A1 and A2 are supplied to the first and second auxiliary electrodes AE1 and AE2, an electric field Eat may be formed between the first and second auxiliary electrodes AE1 and AE2, and thus the light emitting elements LD may be rotated and aligned. In addition, when auxiliary signals (e.g., predetermined auxiliary signals) A3 and A4 are supplied to the third and fourth auxiliary electrodes AE3 and AE4, an electric field Ea2 may be formed between the third and fourth auxiliary electrodes AE3 and AE4, and thus the light emitting elements LD may be rotated and aligned. As described above, to reduce or minimize the rotation of the light emitting elements LD in the reverse direction by the formation of the electric field Em in the opposite direction due to the alignment signals M1 and M2 in the second period t1 to t2, the first auxiliary signal A1 and the third auxiliary signal A3 may be configured of a signal of a phase that is different from that of the first alignment signal M1. For example, the first auxiliary signal A1 and/or the third auxiliary signal A3 may be a signal having the same amplitude as the first alignment signal M1 while having a respective phase difference. For example, the first auxiliary signal A1 may be a signal generated by phase-modulating (for example, by sequentially phase-delaying) the first alignment signal M1 by about 120° using a phase shifter. In addition, the third auxiliary signal A3 may be a signal generated by phase-modulating (for example, by sequentially phase-delaying) the first alignment signal M1 by about 240° using a phase shifter. For example, during the second period t1 to t2, when the first alignment signal M1 is set to a voltage of a negative polarity, the first auxiliary signal A1 and/or the third auxiliary signal A3 may be set to a voltage of a positive polarity. For example, during the second period t1 to t2, when the first alignment signal M1 is set to the voltage of the negative polarity, the first auxiliary signal A1 may be changed from a voltage of a positive polarity to a voltage of a negative polarity, and the third auxiliary signal A3 may be changed from a voltage of a negative polarity to a voltage of a positive polarity. For example, even though the first auxiliary signal A1 is set to a voltage of the negative polarity during the second period t1 to t2, the third auxiliary signal A3 may be set to the voltage of the positive polarity. In addition, even though the third auxiliary signal A3 is set to the voltage of the negative polarity during the second period t1 to t2, the first auxiliary signal A1 may be set to the voltage of the positive polarity. Accordingly, even though the electric field Em by the alignment signals M1 and M2 is formed in the opposite direction during the second period t1 to t2, the electric fields Eat and Ea2 may be formed so that the light emitting elements LD may rotate in the forward direction using the auxiliary signals A1, A2, A3, and A4. Therefore, because the rotation of the light emitting elements LD in the reverse direction during the second period t1 to t2 may be reduced or minimized, the deflection alignment efficiency of the light emitting elements LD may be improved.

Figure 18:
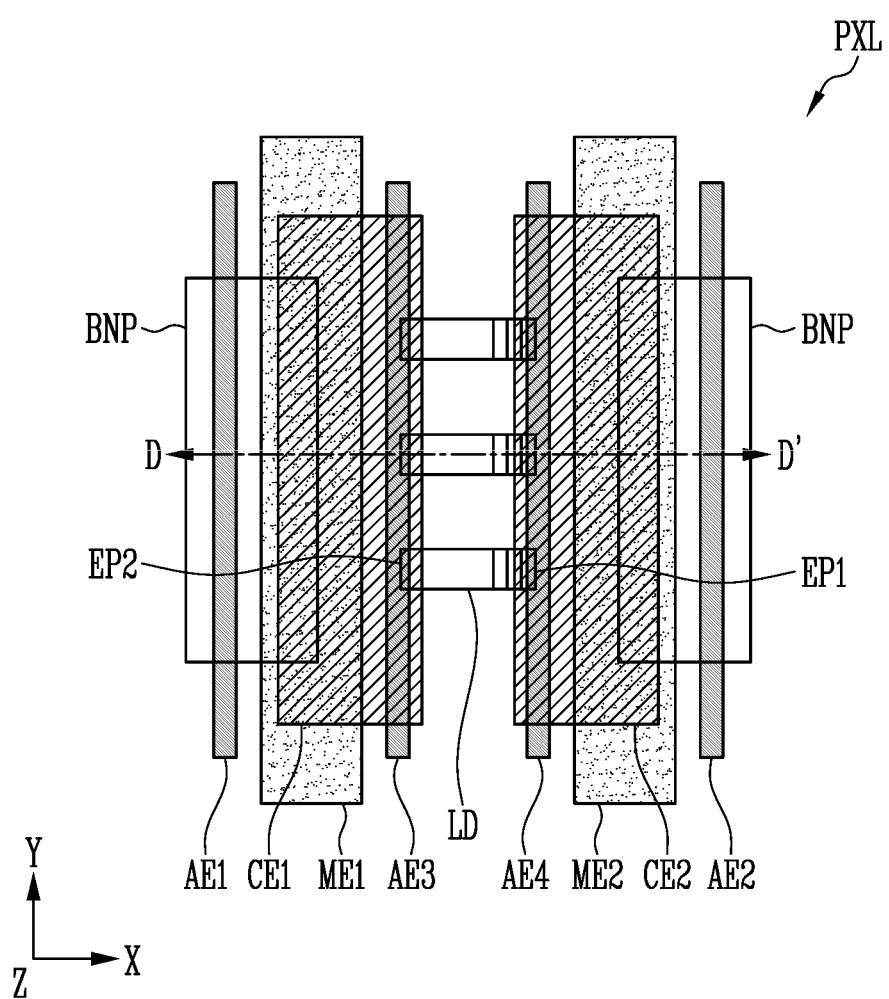
FIG. 18 is a plan view illustrating a pixel according to still other embodiments.
Figure 19:
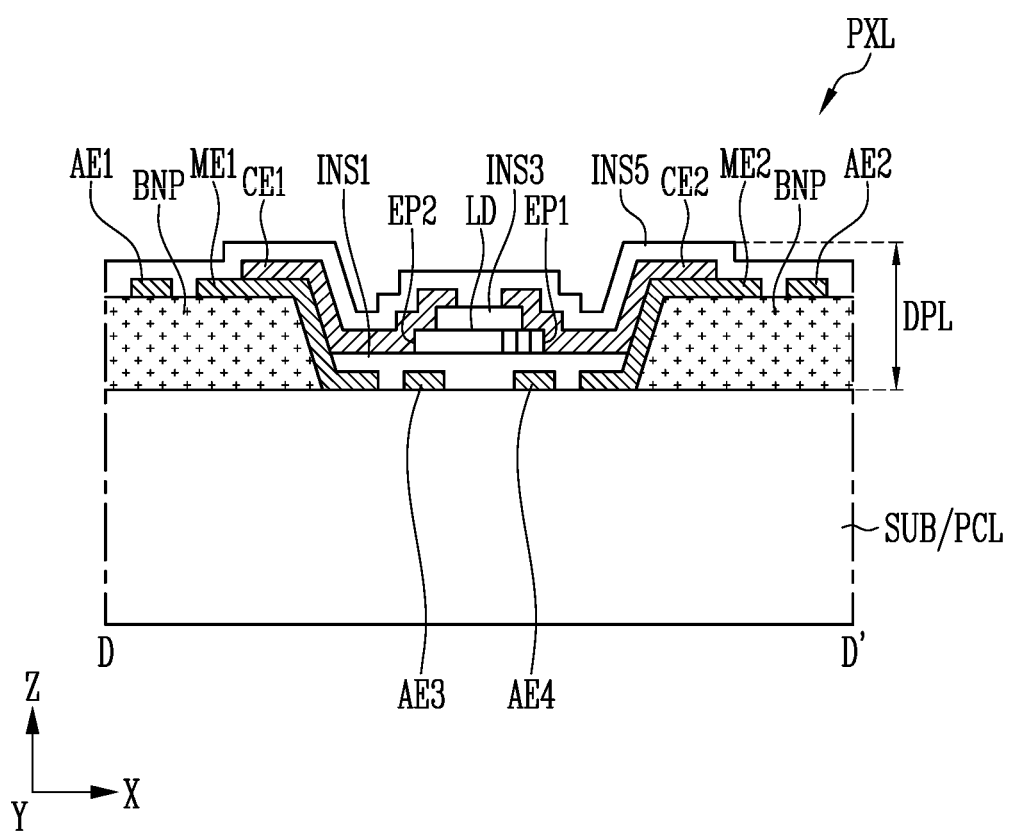
FIG. 19 is a cross-sectional view taken along the line D-D' of FIG. 18.

FIG. 18 is a plan view illustrating a pixel according to still other embodiments, and FIG. 19 is a cross-sectional view taken along the line D-D' of FIG. 18.

Referring to FIGS. 18 and 19, the display device according to some embodiments is distinguished from the embodiments of FIGS. 14 to 17 in that the alignment electrodes ME1 and ME2 are located between the auxiliary electrodes AE1, AE2, AE3, and AE4.

For example, the first and second alignment electrodes ME1 and ME2 may be located between the first and second auxiliary electrodes AE1 and AE2. The first alignment electrode ME1 may be located between the first auxiliary electrode AE1 and the third auxiliary electrode AE3, and the second alignment electrode ME2 may be located between the second auxiliary electrode AE2 and the fourth auxiliary electrode AE4.

In addition, the third and fourth auxiliary electrodes AE3 and AE4 may be located between the first and second alignment electrodes ME1 and ME2. The third auxiliary electrode AE3 may be located between the first alignment electrode ME1 and the light emitting elements LD, and the fourth auxiliary electrode AE4 may be located between the second alignment electrode ME2 and the light emitting elements LD.

In addition, because a detailed description of the alignment electrodes ME1 and ME2 and the auxiliary electrodes AE1, AE2, AE3, and AE4 is described above with reference to FIGS. 1 to 17, a repetitive description is omitted.

Figure 20:
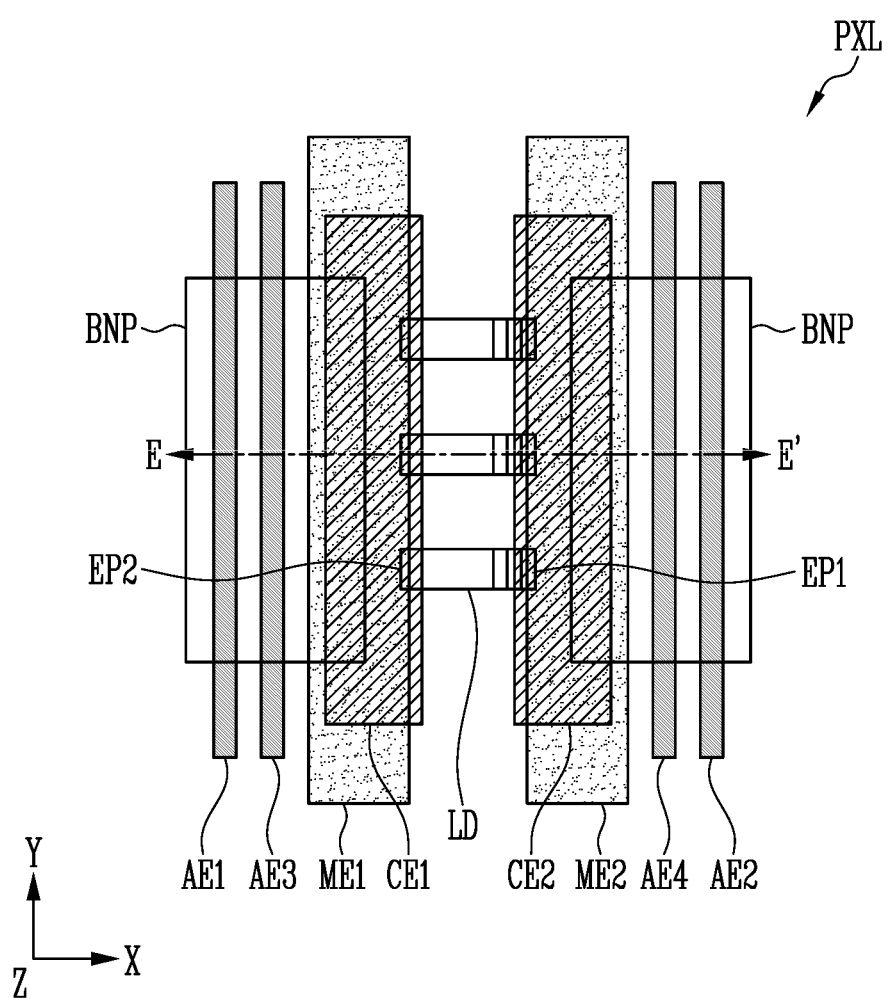
FIG. 20 is a plan view illustrating a pixel according to still other embodiments.
Figure 21:
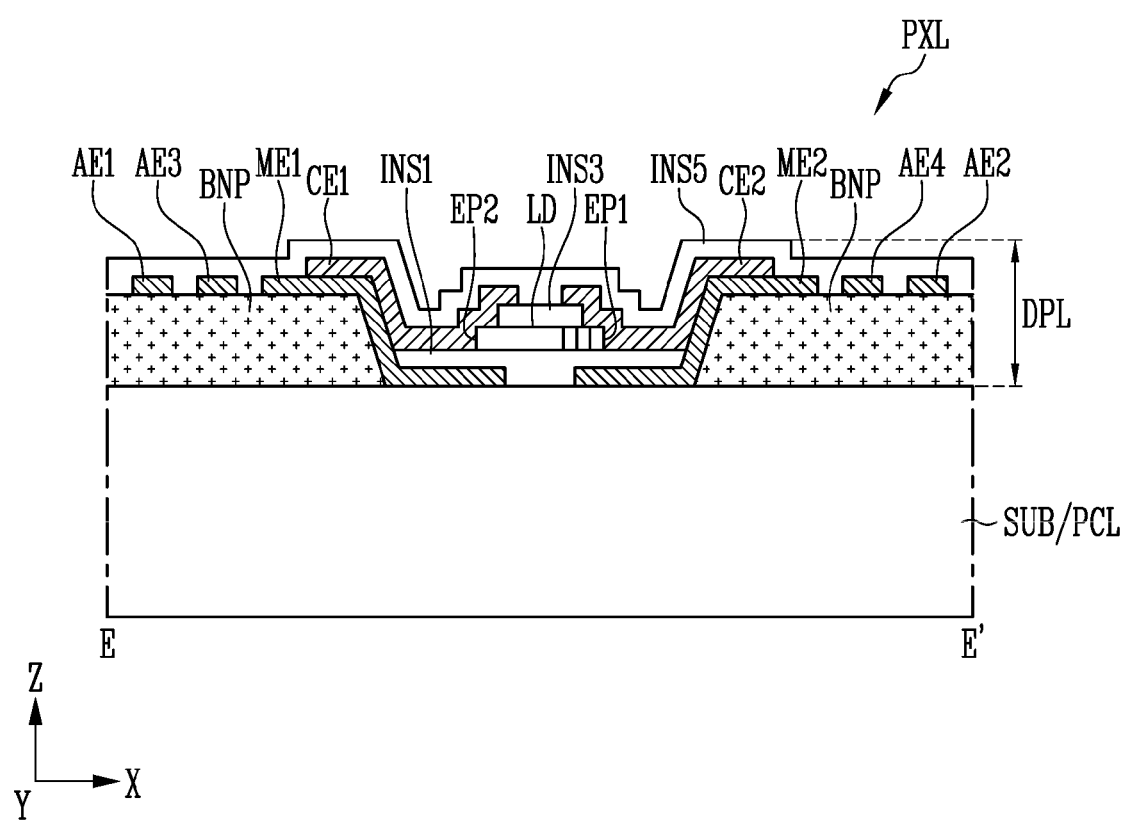
FIG. 21 is a cross-sectional view taken along the line E-E' of FIG. 20.

FIG. 20 is a plan view illustrating a pixel according to still other embodiments, and FIG. 21 is a cross-sectional view taken along the line E-E' of FIG. 20.

Referring to FIGS. 20 and 21, the display device according to some embodiments is distinguished from the embodiments of FIGS. 14 to 19 in that the alignment electrodes ME1 and ME2 are located between the auxiliary electrodes AE1, AE2, AE3 and AE4, and the light emitting elements LD.

For example, the third and fourth auxiliary electrodes AE3 and AE4 may be located between the first and second auxiliary electrodes AE1 and AE2, and the first and second alignment electrodes ME1 and ME2 may be located between the third and fourth auxiliary electrodes AE3 and AE4. That is, the third auxiliary electrode AE3 may be located between the first auxiliary electrode AE1 and the first alignment electrode ME1, and the fourth auxiliary electrode AE4 may be located between the second auxiliary electrode AE2 and the second alignment electrode ME2. In addition, the first alignment electrode ME1 may be located between the third auxiliary electrode AE3 and the light emitting elements LD, and the second alignment electrode ME2 may be located between the fourth auxiliary electrode AE4 and the light emitting elements LD.

In addition, because a detailed description of the alignment electrodes ME1 and ME2 and the auxiliary electrodes AE1, AE2, AE3, and AE4 is described above with reference to FIGS. 1 to 17, a repetitive description is omitted.

Subsequently, a method of manufacturing the display device according to the above-described embodiments is described.

FIGS. 22 to 25 are plan views for respective process operations of a method of manufacturing a display device according to some embodiments. FIGS. 22 to 25 are plan views illustrating the method of manufacturing the display device of FIG. 5, and components substantially the same as those of FIG. 5 are denoted by the same reference numerals and detailed reference numerals are omitted.

Figure 22:
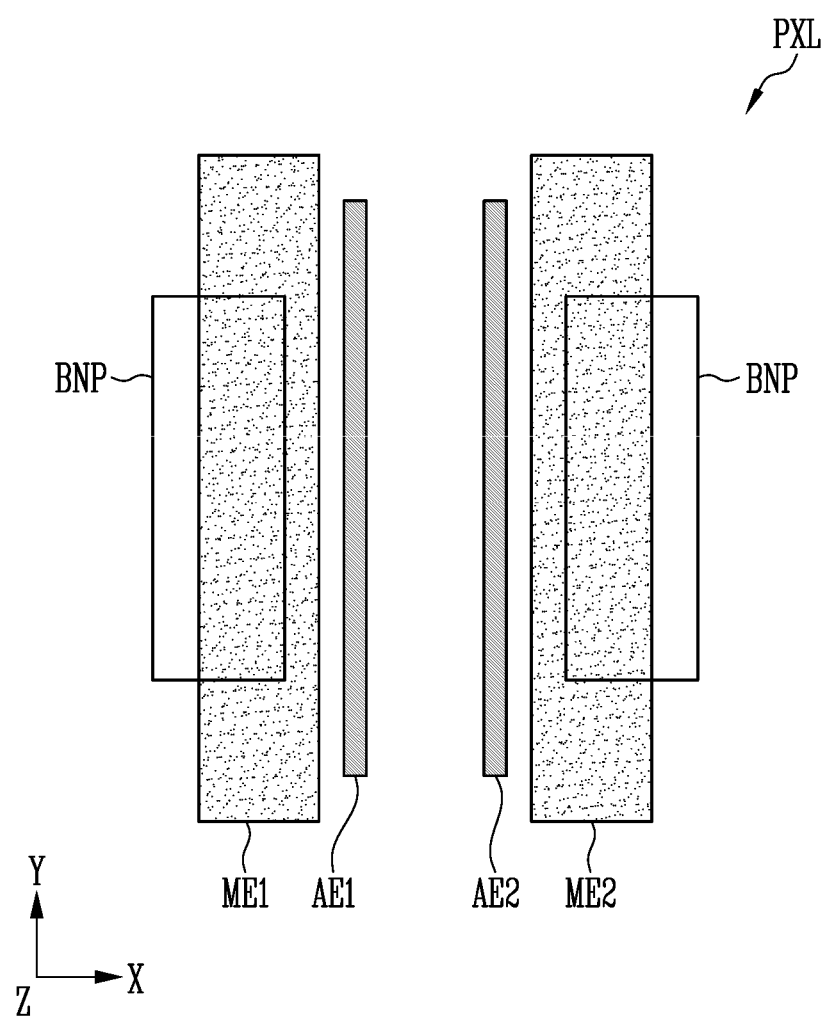
FIGS. 22 to 25 are plan views for respective process operations of a method of manufacturing a display device according to some embodiments.

Referring to FIG. 22, first, the first and second alignment electrodes ME1 and ME2 and the first and second auxiliary electrodes AE1 and AE2, which are spaced apart from each other, are formed on the bank pattern BNP.

The bank pattern BNP may be formed of at least one organic material and/or inorganic material. For example, the bank pattern BNP may be formed of an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the bank pattern BNP may be formed of various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The first and second alignment electrodes ME1 and ME2 may be formed to at least partially overlap the bank pattern BNP. The first and second alignment electrodes ME1 and ME2 may be formed to be separated from each other in the first direction (X-axis direction).

The first and second auxiliary electrodes AE1 and AE2 may be formed between the first and second alignment electrodes ME1 and ME2. The first and second auxiliary electrodes AE1 and AE2 may be formed separately from the first alignment electrode ME1 and/or the second alignment electrode ME2.

The first and second auxiliary electrodes AE1 and AE2 may be formed concurrently or substantially simultaneously with the first and second alignment electrodes ME1 and ME2. In this case, because the number of masks may be reduced, a manufacturing process of the display device may be simplified. However, the disclosure is not limited thereto, and a formation order of the first and second alignment electrodes ME1 and ME2 and the first and second auxiliary electrodes AE1 and AE2 may be variously changed. For example, the first and second alignment electrodes ME1 and ME2 may be formed first, an insulating layer may be formed on the first and second alignment electrodes ME1 and ME2, and then the first and second auxiliary electrodes AE1 and AE2 may be formed on the insulating layer. Alternatively, the first and second auxiliary electrodes AE1 and AE2 may be formed first, an insulating layer may be formed on the first and second auxiliary electrodes AE1 and AE2, and then the first and second alignment electrodes ME1 and ME2 may be formed on the insulating layer.

Figure 23:
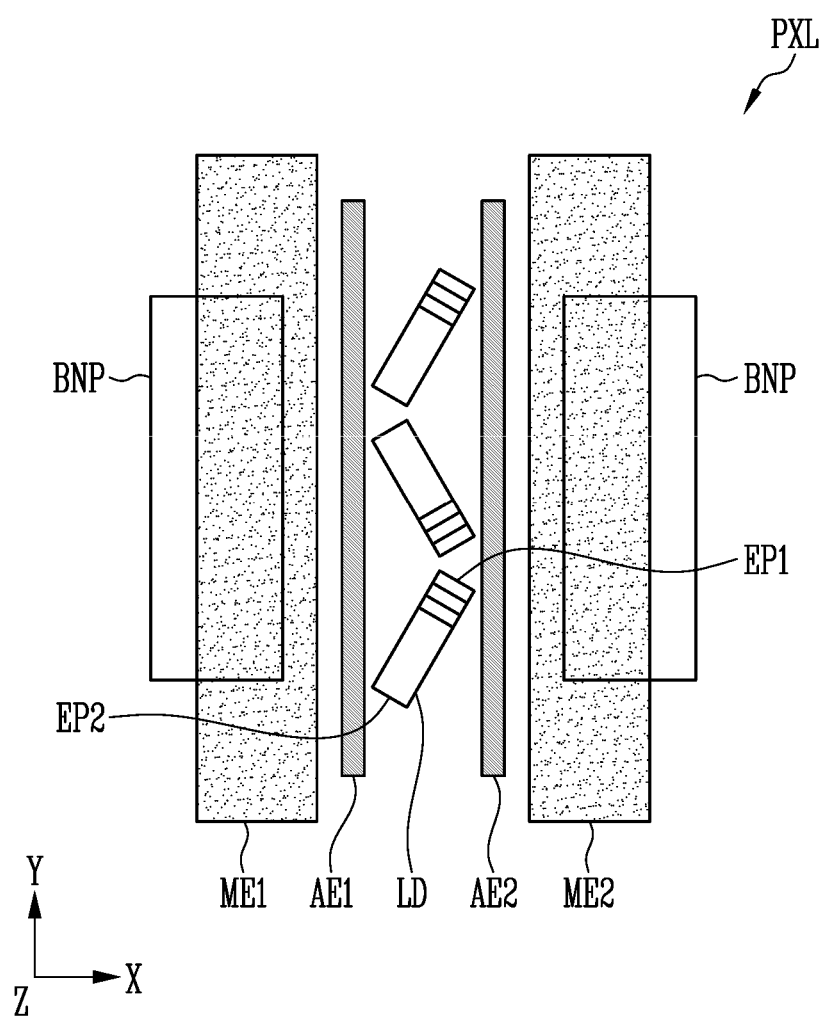

Referring to FIG. 23, subsequently, the light emitting elements LD are provided in each of the pixels PXL. The light emitting elements LD may be supplied between the first and second alignment electrodes ME1 and ME2 spaced apart from each other. In addition, the light emitting elements LD may be supplied between the first and second auxiliary electrodes AE1 and AE2 spaced apart from each other. For example, the light emitting elements LD may be supplied to the emission area of each pixel PXL through an inkjet method, a slit coating method, or other various methods, but are not limited thereto.

Figure 24:
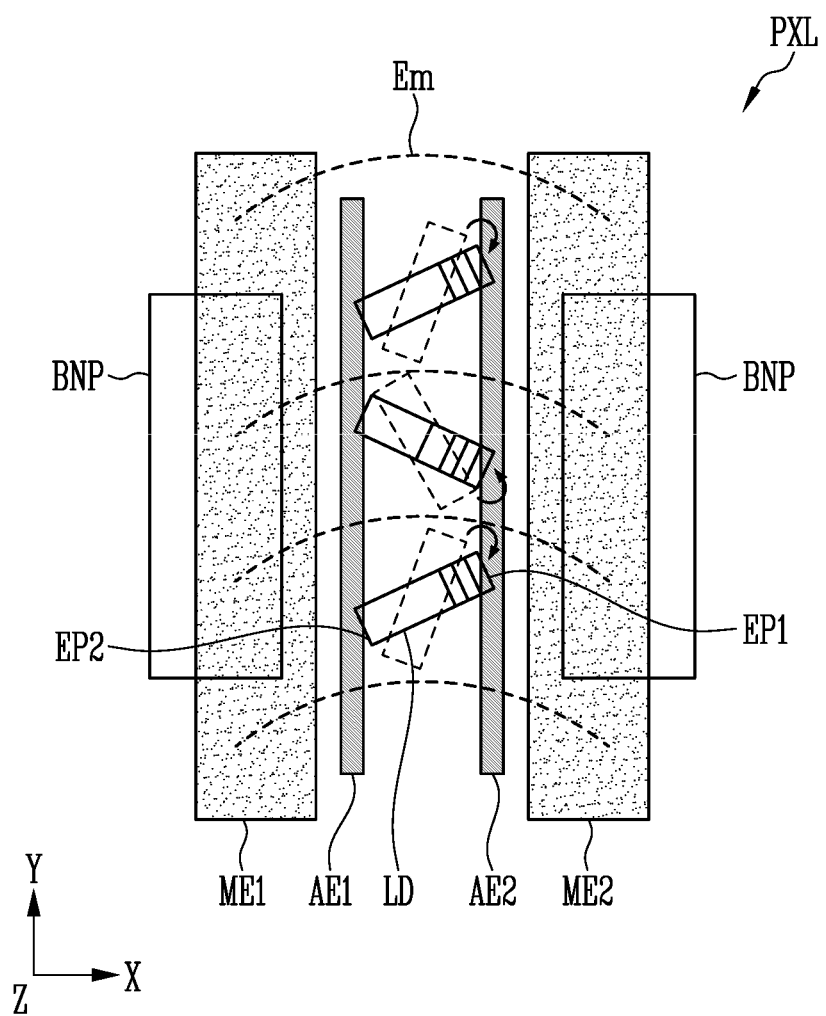
Figure 25:
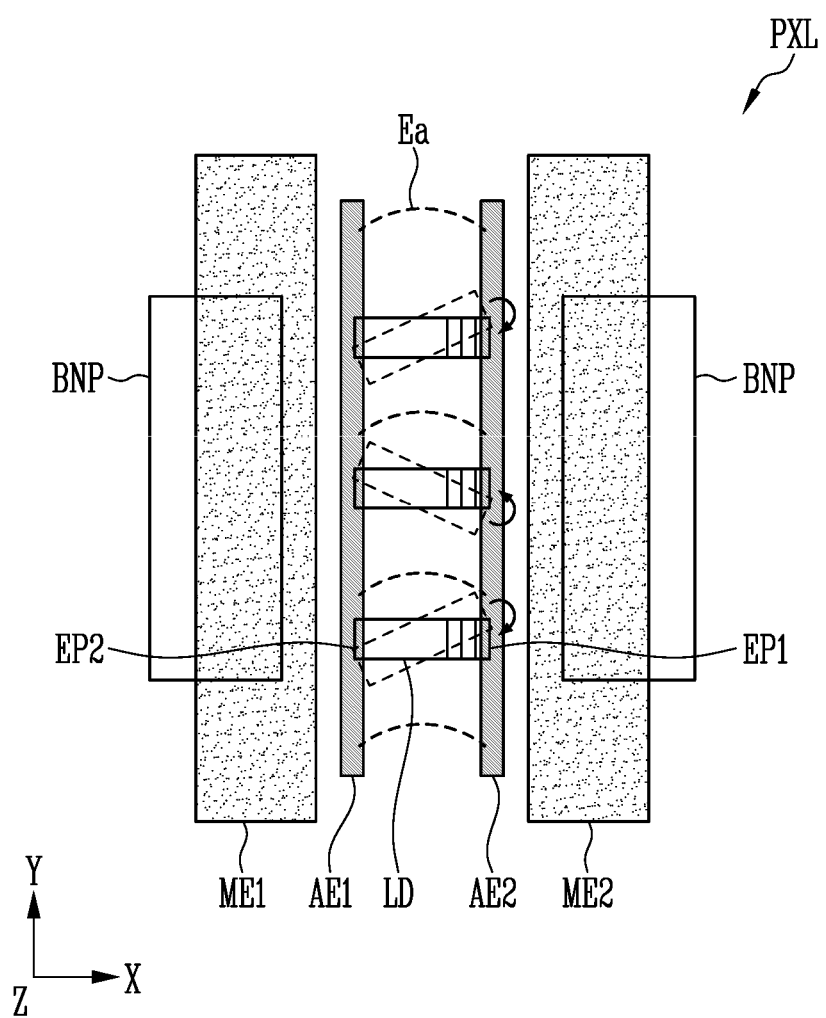

Referring to FIGS. 24 and 25, subsequently, the light emitting elements LD are aligned between the first and second alignment electrodes ME1 and ME2. In a process of aligning the light emitting elements LD, the first alignment signal M1 of FIG. 10 may be applied to the first alignment electrode ME1, and the second alignment signal M2 of FIG. 10 may be applied to the second alignment electrode ME2. Accordingly, the electric field Em may be formed between the first and second alignment electrodes ME1 and ME2, and thus the light emitting elements LD supplied to each pixel PXL may be aligned between the first and second alignment electrodes ME1 and ME2.

In addition, in the process of aligning the light emitting elements LD, the first auxiliary signal A1 of FIG. 10 may be applied to the first auxiliary electrode AE1, and the second auxiliary signal A2 of FIG. 10 may be applied to the second auxiliary electrode AE2. Accordingly, the electric field Ea may be formed between the first and second auxiliary electrodes AE1 and AE2, and thus the light emitting elements LD may be easily deflected and aligned.

For example, referring to FIG. 24, the electric field Em may be formed between the first and second alignment electrodes ME1 and ME2 by the alignment signals M1 and M2 during the first period t0 to t1 of FIG. 11. The light emitting elements LD may be aligned with a directionality between the first and second alignment electrodes ME1 and ME2 by the electric field Em by the alignment signals M1 and M2. For example, the light emitting elements LD may be aligned in the forward direction so that the first end portion EP1 faces the second alignment electrode ME2 and the second end portion EP2 faces the first alignment electrode ME1.

Referring to FIG. 25, as described above, even though the electric field Em by the alignment signals M1 and M2 is formed in the opposite direction during the second period (t1 to t2 in FIG. 11), and thus the alignment degree of the light emitting elements LD is reduced, the electric field Ea may be formed so that the light emitting elements LD may rotate in the forward direction by applying the auxiliary signals A1 and A2 to the first and second auxiliary electrodes AE1 and AE2, respectively. That is, because the rotation of the light emitting elements LD in the reverse direction during the second period t1 to t2 may be reduced or minimized, the deflection alignment efficiency of the light emitting elements LD may be improved. To this end, the first auxiliary signal A1 may be configured of a signal of a phase that is different from that of the first alignment signal M1. For example, as described with reference to FIG. 10, the first auxiliary signal A1 may be a signal having the same amplitude as the first alignment signal M1 and having a phase difference. For example, when the first alignment signal M1 is set to a voltage of a negative polarity during the second period t1 to t2, the first auxiliary signal A1 may be set to a voltage of a positive polarity. However, the disclosure is not limited thereto, and a waveform of the alignment signals M1 and M2 and the auxiliary signals A1 and A2 may be variously changed according to some embodiments in consideration of the direction of the electric field. In addition, because the alignment signals M1 and M2 and the auxiliary signals A1 and A2 are described above with reference to FIG. 10, a repetitive description is omitted.

Subsequently, the first and second connection electrodes CE1 and CE2 may be formed on the deflected and aligned light emitting elements LD, and thus the display device shown in FIG. 5 may be completed.

Each of the first and second connection electrodes CE1 and CE2 may be formed of various transparent conductive materials. For example, the first and second connection electrodes CE1 and CE2 may include at least one of various transparent conductive materials including indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), or fluorine tin oxide (FTO), and may be formed to be substantially transparent or translucent to satisfy a light transmittance (e.g., a predetermined light transmittance). Accordingly, the light emitted from the first and second end portions EP1 and EP2 of the light emitting elements LD may pass through the first and second connection electrodes CE1 and CE2 and may be emitted to the outside of the display panel PNL.

The first connection electrode CE1 may be located on the second end portion EP2 of the light emitting elements LD, and may electrically connect the light emitting elements LD and the first alignment electrode ME1. In this case, the first connection electrode CE1 may be electrically separated from the first auxiliary electrode AE1, but the present disclosure is not limited thereto.

The second connection electrode CE2 may be located on the first end portion EP1 of the light emitting elements LD, and may electrically connect the light emitting elements LD and the second alignment electrode ME2. In this case, the second connection electrode CE2 may be electrically separated from the second auxiliary electrode AE2, but the present disclosure is not limited thereto.

Hereinafter, other embodiments is described. In the following embodiments, the components the same as previously described components are referred to by the same reference numerals, and a repetitive description is omitted or simplified.

FIGS. 26 to 29 are plan views for respective process operations of a method of manufacturing a display device according to other embodiments. FIGS. 26 to 29 are plan views illustrating the method of manufacturing the display device of FIG. 14, and components substantially the same as those of FIG. 14 are denoted by the same reference numerals and detailed reference numerals are omitted.

Figure 26:
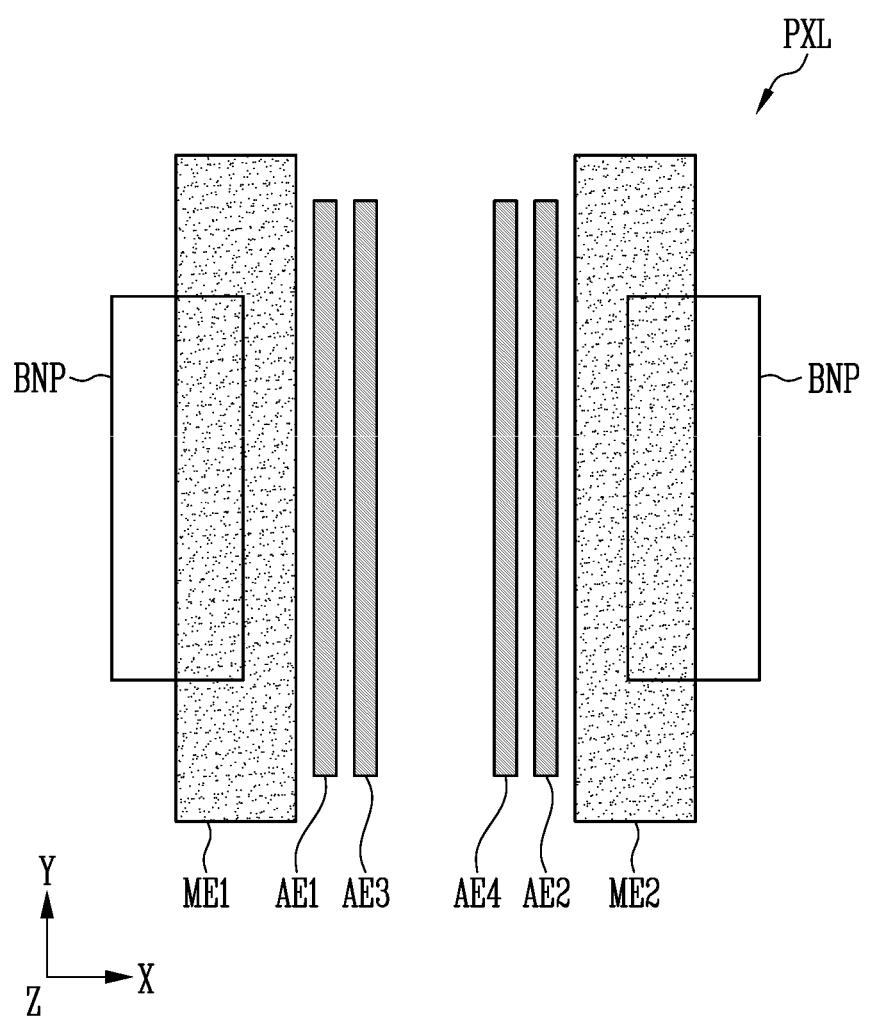
FIGS. 26 to 29 are plan views for respective process operations of a method of manufacturing a display device according to other embodiments.

Referring to FIG. 26, first, the first and second alignment electrodes ME1 and ME2, the first and second auxiliary electrodes AE1 and AE2, and the third and fourth auxiliary electrodes AE3 and AE4 spaced apart from each other are formed on the bank pattern BNP.

The third and fourth auxiliary electrodes AE3 and AE4 may be formed between the first alignment electrode ME1 and the second alignment electrode ME2. The third and fourth auxiliary electrodes AE3 and AE4 may be formed separately from the first alignment electrode ME1 and/or the second alignment electrode ME2. In addition, the third and fourth auxiliary electrodes AE3 and AE4 may be formed between the first auxiliary electrode AE1 and the second auxiliary electrode AE2. The third and fourth auxiliary electrodes AE3 and AE4 may be formed separately from the first auxiliary electrode AE1 and/or the second auxiliary electrode AE2.

The third and fourth auxiliary electrodes AE3 and AE4 may be formed concurrently or substantially simultaneously with the first and second auxiliary electrodes AE1 and AE2 and/or the first and second alignment electrodes ME1 and ME2. In this case, because the number of masks may be reduced, the manufacturing process of the display device may be simplified. However, the disclosure is not limited thereto, and a formation order of the first and second alignment electrodes ME1 and ME2, the first and second auxiliary electrodes AE1 and AE2, and the third and fourth auxiliary electrodes AE3 and AE4 may be variously changed.

In addition, because the method of manufacturing the bank pattern BNP, the first and second alignment electrodes ME1 and ME2, and the first and second auxiliary electrodes AE1 and AE2 is described with reference to FIG. 22, a repetitive description is omitted.

Figure 27:
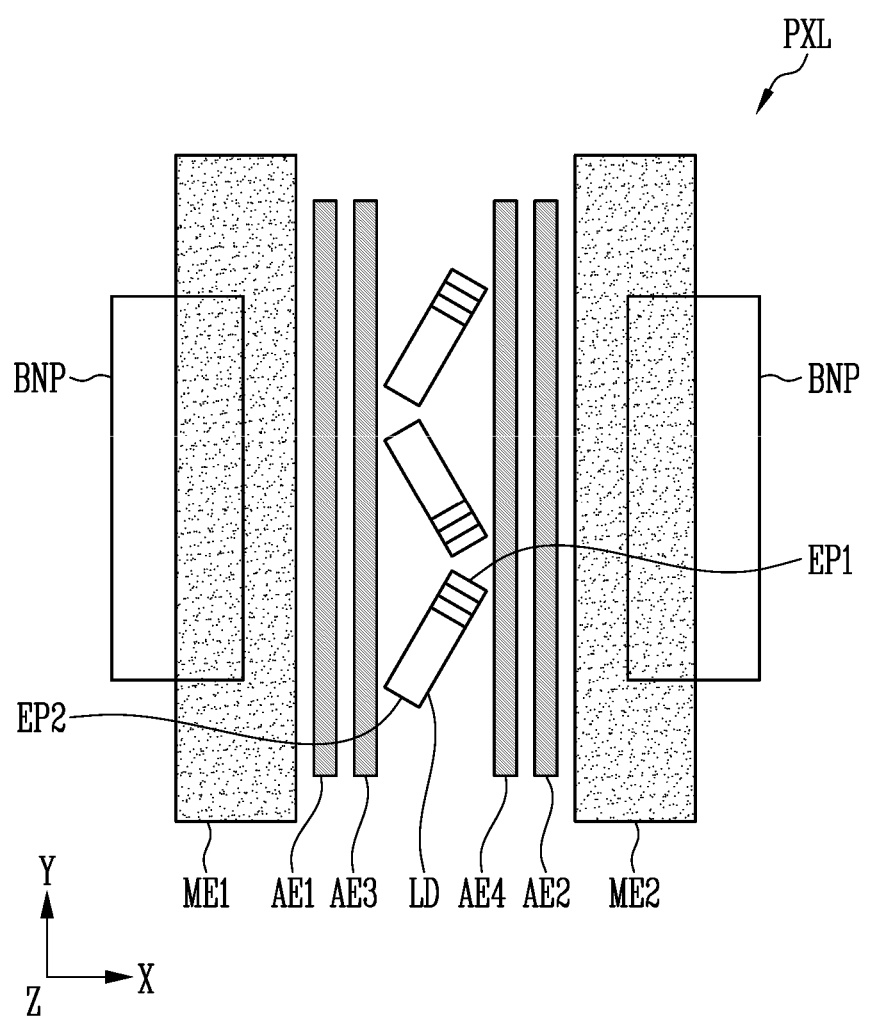

Referring to FIG. 27, subsequently, the light emitting elements LD are provided in each of the pixels PXL. For example, the light emitting elements LD may be supplied to the emission area of each pixel PXL through an inkjet method, a slit coating method, or other various methods, but are not limited thereto.

Figure 28:
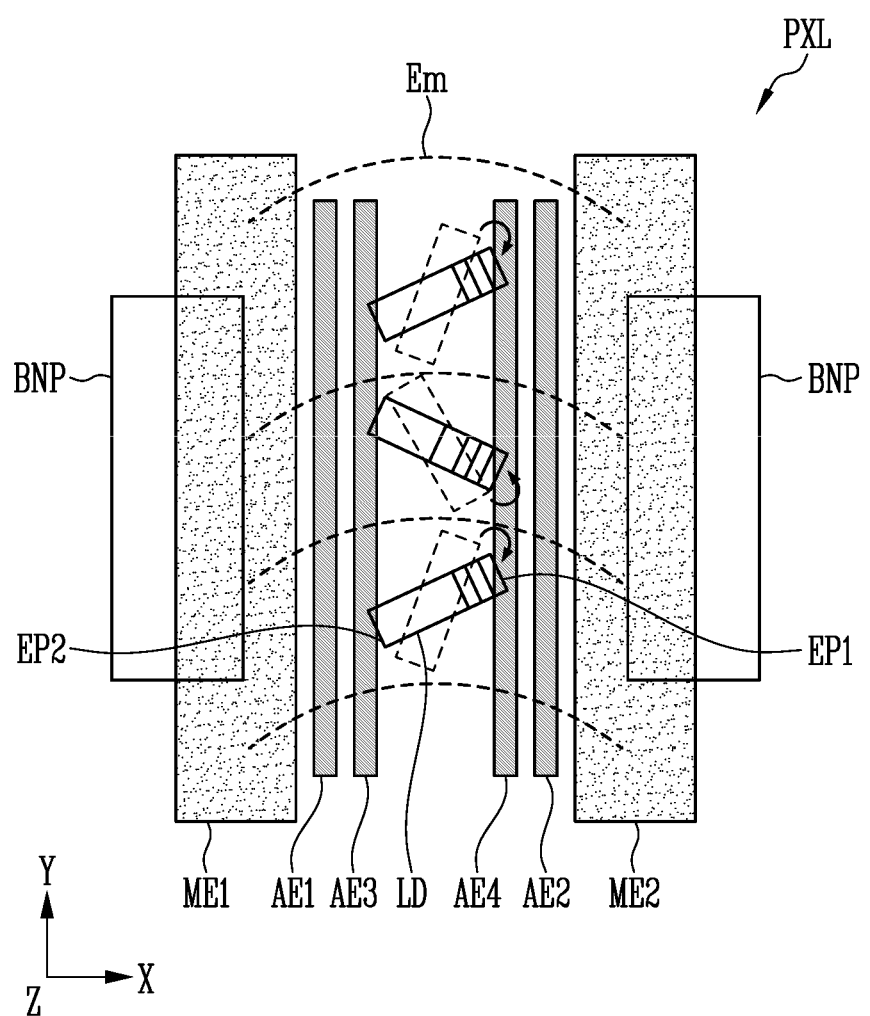
Figure 29:
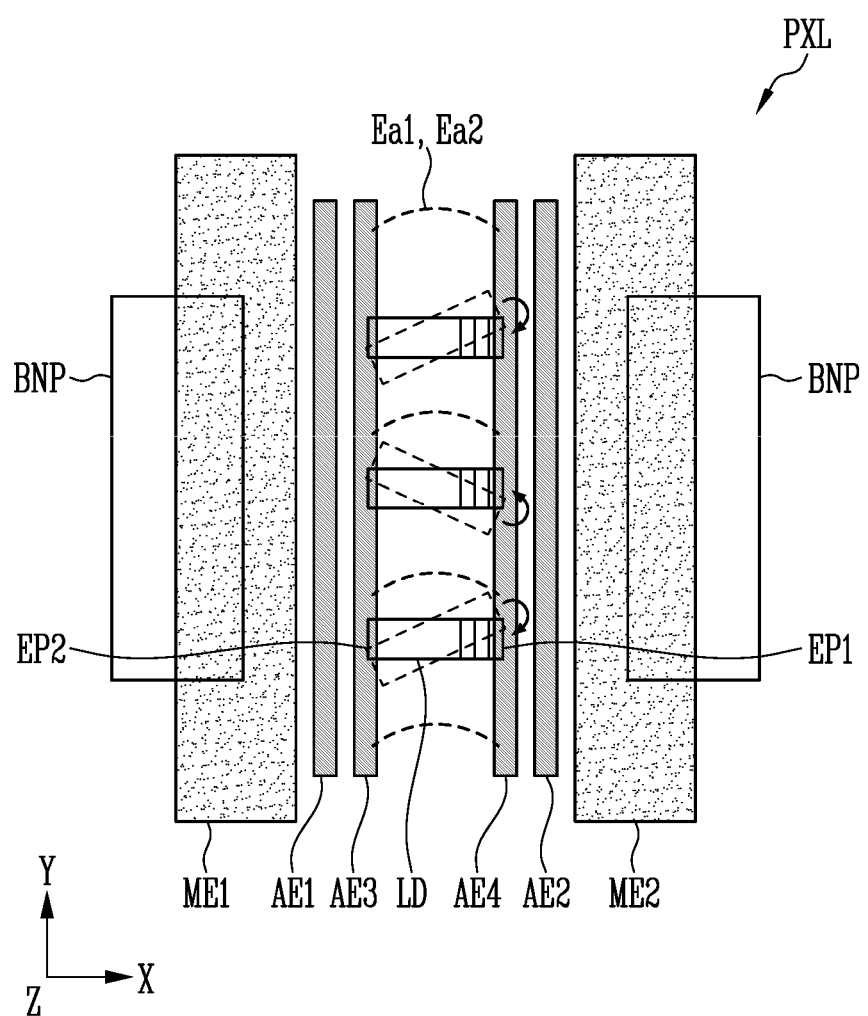

Referring to FIGS. 28 and 29, subsequently, the light emitting elements LD are aligned between the first and second alignment electrodes ME1 and ME2. In the process of aligning the light emitting elements LD, the first alignment signal M1 of FIG. 16 may be applied to the first alignment electrode ME1, and the second alignment signal M2 of FIG. 16 may be applied to the second alignment electrode ME2. Accordingly, the electric field Em may be formed between the first and second alignment electrodes ME1 and ME2, and thus the light emitting elements LD supplied to each pixel PXL may be aligned between the first and second alignment electrodes ME1 and ME2.

In addition, in the process of aligning the light emitting elements LD, the first auxiliary signal A1 of FIG. 16 may be applied to the first auxiliary electrode AE1, the second auxiliary signal A2 of FIG. 16 may be applied to the second auxiliary electrode AE2, the third auxiliary signal A3 of FIG. 16 may be applied to the third auxiliary electrode AE3, and the fourth auxiliary signal A4 of FIG. 16 may be applied to the fourth auxiliary electrode AE4. Accordingly, the electric field Ea1 of FIG. 17 may be formed between the first and second auxiliary electrodes AE1 and AE2, and the electric field Ea2 of FIG. 17 may be formed between the third and fourth auxiliary electrodes AE3 and AE4. Thus, the light emitting elements LD may be easily deflected and aligned.

For example, referring to FIG. 28, during the first period t0 to t1 of FIG. 16, the electric field Em may be formed between the first and second alignment electrodes ME1 and ME2 by the alignment signals M1 and M2. The light emitting elements LD may be aligned with a directionality between the first and second alignment electrodes ME1 and ME2 by the electric field Em by the alignment signals M1 and M2. For example, the light emitting elements LD may be aligned in the forward direction so that the first end portion EP1 faces the second alignment electrode ME2 and the second end portion EP2 faces the first alignment electrode ME1.

Referring to FIG. 29, as described above, even though the electric field Em by the alignment signals M1 and M2 is formed in the opposite direction during the second period t1 to t2 of FIG. 16 and the alignment degree of the light emitting elements LD is reduced, the electric fields Eat and Ea2 may be formed so that the light emitting elements LD may rotate in the forward direction by applying the auxiliary signals A1, A2, A3, and A4 to the first to fourth auxiliary electrodes AE1, AE2, AE3, and AE4. That is, because the rotation of the light emitting elements LD in the reverse direction during the second period t1 to t2 may be reduced or minimized, the deflection alignment efficiency of the light emitting elements LD may be improved. To this end, the first auxiliary signal A1 and/or the third auxiliary signal A3 may be configured of a signal of a phase that is different from that of the first alignment signal M1. For example, as described with reference to FIG. 16, the first auxiliary signal A1 and/or the third auxiliary signal A3 may be a signal having the same amplitude as the first alignment signal M1 and having a phase difference. For example, the first auxiliary signal A1 may be a signal generated by phase-modulating (for example, by sequentially phase-delaying) the first alignment signal M1 by about 120° using a phase shifter. In addition, the third auxiliary signal A3 may be a signal generated by phase-modulating (for example, by sequentially phase-delaying) the first alignment signal M1 by 240° using a phase shifter. For example, during the second period t1 to t2, when the first alignment signal M1 is set to a voltage of a negative polarity, the first auxiliary signal A1 and/or the third auxiliary signal A3 may be set to a voltage of a positive polarity. For example, during the second period t1 to t2, when the first alignment signal M1 is set to the voltage of the negative polarity, the first auxiliary signal A1 may be changed from a voltage of a positive polarity to a voltage of a negative polarity, and the third auxiliary signal A3 may be changed from a voltage of a negative polarity to a voltage of a positive polarity. For example, even though the first auxiliary signal A1 is set to the voltage of the negative polarity during the second period t1 to t2, the third auxiliary signal A3 may be set to the voltage of the positive polarity. In addition, even though the third auxiliary signal A3 is set to the voltage of the negative polarity during the second period t1 to t2, the first auxiliary signal A1 may be set to the voltage of the positive polarity. However, the disclosure is not limited thereto, and a waveform of the alignment signals M1 and M2 and the auxiliary signals A1, A2, A3, and A4 may be variously changed according to some embodiments in consideration of the direction of the electric field. In addition, because the alignment signals M1 and M2 and the auxiliary signals A1, A2, A3, and A4 are described above with reference to FIG. 16, a repetitive description is omitted.

Subsequently, the first and second connection electrodes CE1 and CE2 may be on the deflected and aligned light emitting elements LD, and thus the display device shown in FIG. 14 may be completed.

The first connection electrode CE1 may be located on the second end portion EP2 of the light emitting elements LD, and may electrically connect the light emitting elements LD and the first alignment electrode ME1. In this case, the first connection electrode CE1 may be electrically separated from the first auxiliary electrode AE1 and/or the third auxiliary electrode AE3, but the present disclosure is not limited thereto.

The second connection electrode CE2 may be located on the first end portion EP1 of the light emitting elements LD, and may electrically connect the light emitting elements LD and the second alignment electrode ME2. In this case, the second connection electrode CE2 may be electrically separated from the second auxiliary electrode AE2 and/or the fourth auxiliary electrode AE4, but the present disclosure is not limited thereto.

Those skilled in the art may understand that the disclosure may be implemented in a modified form without departing from the above-described essential characteristic. Therefore, the disclosed methods should be considered in a description point of view not a limitation point of view. The scope of the disclosure is shown in the claims not in the above description, and all differences within the scope will be construed as being included in the disclosure.

What is claimed is:

1. A display device comprising:
a first alignment electrode and a second alignment electrode spaced apart from each other;
a light emitting element between the first alignment electrode and the second alignment electrode;
a first auxiliary electrode at a first side of the light emitting element in a plan view, and separated from the first alignment electrode; and
a second auxiliary electrode at a second side of the light emitting element in a plan view, and separated from the second alignment electrode,
wherein an alignment signal is configured to be applied to the first alignment electrode,
wherein a first auxiliary signal of a phase that is different from a phase of the alignment signal is configured to be applied to the first auxiliary electrode, and
wherein respective bottom surfaces of the first auxiliary electrode, the second auxiliary electrode, the first alignment electrode, and the second alignment electrode all contact a same layer.

2. The display device according to claim 1, wherein the first auxiliary electrode is between the first alignment electrode and a center of the light emitting element in a plan view, and
wherein the second auxiliary electrode is between the second alignment electrode and the center of the light emitting element in a plan view.

3. The display device according to claim 2, further comprising:
a third auxiliary electrode between the first auxiliary electrode and the center of the light emitting element in a plan view, and separated from the first auxiliary electrode; and
a fourth auxiliary electrode between the second auxiliary electrode and the center of the light emitting element in a plan view, and separated from the second auxiliary electrode.

4. The display device according to claim 1, wherein the first alignment electrode is between the first auxiliary electrode and the light emitting element in a plan view, and
wherein the second alignment electrode is between the second auxiliary electrode and the light emitting element in a plan view.

5. The display device according to claim 4, further comprising:
a third auxiliary electrode between the first alignment electrode and a center of the light emitting element in a plan view; and
a fourth auxiliary electrode between the second alignment electrode and the center of the light emitting element in a plan view.

6. The display device according to claim 5, wherein the third auxiliary electrode is electrically separated from the first alignment electrode and the first auxiliary electrode.

7. The display device according to claim 4, further comprising:
- a third auxiliary electrode between the first auxiliary electrode and the first alignment electrode in a plan view; and
- a fourth auxiliary electrode between the second auxiliary electrode and the second alignment electrode in a plan view.

8. The display device according to claim 7, wherein the third auxiliary electrode is configured to receive a second auxiliary signal of a phase that is different from a phase of the alignment signal and a phase of the first auxiliary signal.

9. The display device according to claim 1, further comprising an insulating layer between the first auxiliary electrode and the first alignment electrode.

10. The display device according to claim 1, further comprising:
- a first connection electrode electrically connecting the first alignment electrode and one end of the light emitting element; and
- a second connection electrode electrically connecting the second alignment electrode and another end of the light emitting element.

11. The display device according to claim 1, wherein the light emitting element is electrically separated from the first auxiliary electrode and the second auxiliary electrode.

* * * * *